(12) United States Patent
Kwan

(10) Patent No.: US 10,175,581 B2
(45) Date of Patent: *Jan. 8, 2019

(54) OPTICAL APPARATUS WITH ADJUSTABLE ACTION OF FORCE ON AN OPTICAL MODULE

(71) Applicant: Carl Zeiss SMT GmbH, Oberkochen (DE)

(72) Inventor: Yim-Bun Patrick Kwan, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/697,724

(22) Filed: Sep. 7, 2017

(65) Prior Publication Data
US 2018/0129138 A1  May 10, 2018

Related U.S. Application Data

(63) Continuation of application No. 14/620,589, filed on Feb. 12, 2015, now Pat. No. 9,766,549, which is a
(Continued)

(30) Foreign Application Priority Data

Jun. 10, 2008 (DE) .................. 10 2008 027 540

(51) Int. Cl.
*G03F 7/20* (2006.01)
*G02B 7/02* (2006.01)
*G02B 7/00* (2006.01)

(52) U.S. Cl.
CPC ......... *G03F 7/70141* (2013.01); *G02B 7/003* (2013.01); *G02B 7/028* (2013.01);
(Continued)

(58) Field of Classification Search
CPC ............. G03F 7/70141; G03F 7/70833; G03F 7/70975; G02B 7/028
See application file for complete search history.

(56) References Cited

U.S. PATENT DOCUMENTS 5,781,277 A 7/1998 Iwamoto
6,487,491 B1 11/2002 Karpman et al.
(Continued)

FOREIGN PATENT DOCUMENTS

EP 0620464 10/1994
JP H03-188430 8/1991
(Continued)

OTHER PUBLICATIONS

International Search Report for corresponding PCT Application No. PCT/EP2009/057183, dated Sep. 1, 2009.
(Continued)

*Primary Examiner* — Steven Whitesell Gordon
(74) *Attorney, Agent, or Firm* — Fish & Richardson P.C.

(57) ABSTRACT

The disclosure pertains to an optical apparatus, in particular for microlithography, that includes an optical module, a support structure and a connection apparatus. The connection apparatus includes at least one connection unit which includes a first connector part and a second connector part. The first connector part is connected to the optical module, and the second connector part is connected to the support structure.

23 Claims, 11 Drawing Sheets

Related U.S. Application Data continuation of application No. 12/963,317, filed on Dec. 8, 2010, now Pat. No. 8,964,165, which is a continuation of application No. PCT/EP2009/057183, filed on Jun. 10, 2009.

(52) U.S. Cl.
CPC ...... *G03F 7/70816* (2013.01); *G03F 7/70833* (2013.01); *G03F 7/70975* (2013.01)

(56) References Cited

U.S. PATENT DOCUMENTS

| | | | |
|---|---|---|---|
| 6,829,107 | B2 | 12/2004 | Osterried |
| 7,529,046 | B2 | 5/2009 | Schletterer et al. |
| 8,964,165 | B2 * | 2/2015 | Kwan ............... G02B 7/028 355/53 |
| 9,766,549 | B2 | 9/2017 | Kwan |
| 2001/0030739 | A1 | 10/2001 | Hase |
| 2003/0178579 | A1 | 9/2003 | Tanaka et al. |
| 2004/0083966 | A1 | 5/2004 | Takahashi et al. |
| 2004/0094722 | A1 | 5/2004 | Bisschops et al. |
| 2007/0030462 | A1 | 2/2007 | Yuan et al. |
| 2007/0097367 | A1 | 5/2007 | Sakamoto |
| 2007/0263189 | A1 | 11/2007 | Butler et al. |
| 2009/0201484 | A1 | 8/2009 | Arai |
| 2009/0274537 | A1 | 11/2009 | Kato |
| 2011/0085239 | A1 | 4/2011 | Kwan |
| 2015/0227055 | A1 | 8/2015 | Kwan |

FOREIGN PATENT DOCUMENTS

| | | |
|---|---|---|
| JP | H03-214114 | 9/1991 |
| JP | H06-018755 | 1/1994 |
| JP | 07-064006 | 3/1995 |
| JP | H10-206714 | 8/1998 |
| JP | 2003-188430 | 7/2003 |
| JP | 2003-214114 | 7/2003 |
| JP | 2006-018755 | 1/2006 |
| JP | 2006-140366 | 6/2006 |
| JP | 2010-206714 | 9/2010 |
| WO | WO 2007/040254 | 4/2007 |
| WO | WO 2007/077920 | 7/2007 |

OTHER PUBLICATIONS

International Preliminary Report on Patentability for corresponding PCT Application No. PCT/EP2009/057183, dated Dec. 23, 2010.
Korean Office Action, with translation thereof, for corresponding KR Appl No. 10-2011-7000402, dated Aug. 27, 2013.
Japanese Office Action with English translation thereof, for corresponding JP Appl No. 2014-141620, 7 pages, dated Jun. 22, 2015.

* cited by examiner

OPTICAL APPARATUS WITH ADJUSTABLE ACTION OF FORCE ON AN OPTICAL MODULE

CROSS-REFERENCE TO RELATED APPLICATIONS

This application is a continuation of, and claims priority under 35 USC 120 to, U.S. application Ser. No. 14/620,589, filed Feb. 12, 2015, now U.S. Pat. No. 9,766,549, which is a continuation of, and claims priority under 35 USC 120 to, U.S. application Ser. No. 12/963,317, filed Dec. 8, 2010, now U.S. Pat. No. 8,964,165, which is a continuation of, and claims priority under 35 USC 120 to, international application No. PCT/EP2009/057183, filed on Jun. 10, 2009, which claims benefit of German Application No. 10 2008 027 540.9, filed Jun. 10, 2008. U.S. application Ser. Nos. 14/620,589 and 12/963,317 and international application PCT/EP2008/007256 are hereby incorporated by reference in their entirety.

FIELD

The disclosure pertains to an optical apparatus, an optical imaging device including such an apparatus, and a method for connecting an optical module with a support structure. The disclosure can be used with any optical apparatus or optical imaging method, such as with the microlithography employed in the manufacture of microelectronic circuits.

BACKGROUND

In particular in the area of microlithography, apart from the use of components designed to have the highest possible precision, it is among other things desirable during operation to retain the optical modules of the imaging device (e.g. the modules with optical elements such as objectives, mirrors and grids) in such a way that they have the smallest possible deviation from a specified set position or a specified set geometry, in order to achieve a correspondingly high imaging quality (wherein within the meaning of the present disclosure the terms optical module can mean both optical elements individually and subassemblies of such optical elements and other components, such as for example holders, etc.).

In the area of microlithography the desired accuracy properties in the microscopic range are of the order of a few nanometers or less. They are not least a consequence of the constant desire to increase the resolution of the optical systems used in the manufacture of microelectronic circuits in order to drive forward the miniaturisation of the microelectronic circuits being produced. With modern lithographic systems in particular, which use a high numerical aperture in order to increase the resolution, highly polarised UV light is employed in order to be able to take full advantage of the high numerical aperture. It can be of particular importance here, therefore, to maintain the polarisation of the light when passing through the optical system. Here a particular problem that arises is the stress-induced birefringence, which is caused by stresses in the optical elements and is responsible for a significant proportion of the polarisation loss in the system. Accordingly it can be desirable to introduce as little undesired stress as possible into the optical module concerned in order to keep to a minimum the negative effects of this on the imaging quality.

One problem in this connection can arise with the creation of the connection between the optical module and the support structure which supports the optical module. The connection between the optical module and the support structure should be as rigid as possible in order to achieve the highest possible, from the dynamic point of view favourable, natural frequency.

This high rigidity of the system also can have considerable disadvantages, however. Tolerances in shape and position of the contact surfaces between the optical module and the support structure can as a general rule only be compensated for via a frictional relative movement and possibly a deformation of the components involved. Whereas the frictional relative movement leads to the introduction of parasitic shear stresses in the optical module, the deformation (as a result of the high rigidity of the system) also results in considerable parasitic stresses in the optical module. In addition, because of the high rigidity of the components involved, these parasitic stresses are only built up over a comparatively long section, so that it is possible for them to propagate well into the optically active components of the optical module where their negative influence on the imaging quality is felt particularly acutely.

SUMMARY

The disclosure is provides an optical apparatus, an optical imaging device or a method for connecting an optical module with a support structure, which does not have the abovementioned disadvantages, or at least has these only to a lesser degree, and, in particular, guarantees in a simple manner a high imaging quality during use.

The disclosure is based, on the one hand, on the finding that it is possible to achieve a reduction in the parasitic stresses that are introduced in the optical module as a result of the latter being supported by a support structure and, thus, a particularly high imaging quality, in that in an adjustment state prior to the assembled state, a narrow gap is maintained between the contact surfaces at the optical module and at the support structure in a contact-free manner, so that a compensating motion between these contact surfaces about at least one of their main curvature axes is possible without action of force resulting from the compensating motion between the optical modules and the support structure.

Maintaining a contact-free gap without the action of force resulting from the compensating motion between the optical module and the support structure has the advantage that this compensating motion does not result in any parasitic forces and moments and, hence, ultimately no parasitic stresses. The action of force to maintain the gap in a contact-free manner between the optical module and the support structure can be generated in any suitable manner. Thus any fluid dynamic, magnetic and electrical operating principle or any combination of these can be used which generates a contact-free corresponding force of action between two bodies, in order to maintain the gap.

By maintaining the narrow gap it is possible, in the adjustment state until just before the contact of the contact surfaces, to perform compensating motions between the joint partners without these resulting in parasitic stresses. Therefore, depending on the size of the gap, it is possible to bring the two contact surfaces into an at least almost ideal position in relation to each other, so that from the subsequent reduction in the gap until ultimate contact between the contact surfaces no further parasitic stresses worth mentioning result.

The size of the narrow gap can basically be dimensioned in any way suitable for the respective application. Advantageous gap sizes range from 5 to 200 In particular, the size of the narrow gap is within a range of a few micrometers, such as between 5 µm and 15 µm (e.g. approximately 10 µm).

In this way, for example, it is possible for the contact between the optical module and the support structure to actually be created at one or more other joint points whereas the narrow gap between the two contact surfaces continues to be maintained. If the narrow gap is then likewise reduced until ultimate contact between the contact surfaces, then from this comparatively small movement (if any) between the contact surfaces on the one hand, but, on the other hand, also in the area of the other joints, only a comparatively small relative movement between the optical module and the support structure results, so that only very slight (if any) parasitic forces or moments and resultant parasitic stresses can result therefrom.

It is particularly advantageous if this principle is applied to a plurality, in particular all, joints between the optical module and the support structure. Additionally, in this case it is advantageous to reduce the respective narrow gap between the contact surfaces concerned synchronously so that the contact surfaces at the various joints substantially touch simultaneously (wherein in the context of the present specification the term "substantially simultaneously" means a maximum time deviation of less than 100 ms, in particular less than 10 ms). As a result of the relative movement caused by the reduction of the gap at one of the joints, induced relative movements in the area of one or more other joints are hereby avoided in an advantageous manner.

It should be noted at this point that the contact surfaces concerned can also be flat surfaces whose main curvature axes can lie at infinity. In this special case, the compensating motion about this main curvature axis (lying at infinity), in other words does not involve a rotational but a translational movement.

According to a first aspect, the disclosure pertains to an optical apparatus, in particular for microlithography, that includes an optical module, a support structure and a connection apparatus. The connection apparatus includes at least one connection unit having a first connector part and a second connector part. The first connector part is connected to the optical module and the second connector part is connected to the support structure. The first connector part includes a first contact surface with a first main curvature that defines a first main curvature axis, whereas the second connector part includes a second contact surface with a second main curvature that defines a second main curvature axis. The second main curvature is matched to the first main curvature and the first contact surface contacts the second contact surface in an installed state. The connection apparatus includes at least part of a positioning device that acts on the first connector part and the second connector part, wherein the positioning device is designed to maintain a narrow gap between the first contact surface and the second contact surface in an adjustment state that exists prior to the installed state in a non-contact manner such that a compensating motion is possible between the first contact surface and the second contact surface about the first main curvature axis without the occurrence of any action of force between the first connector part and the second connector part resulting from the compensating motion.

According to a further aspect, the disclosure pertains to an optical imaging device, in particular for microlithography, that includes an illumination device with a first optical element group, a masking device to accommodate a projection pattern including a mask, a projection device with a second optical element group and a substrate device to accommodate a substrate. The illumination device is designed to illuminate the projection pattern using the first optical element group, whereas the second optical element group is designed to project the projection pattern onto the substrate. The illumination device and/or the projection device includes an optical module, a support structure and a connection apparatus, wherein the connection apparatus includes at least one connection unit with a first connector part and a second connector part. The first connector part is connected to the optical module and the second connector part is connected to the support structure. The first connector part includes a first contact surface with a first main curvature that defines a first main curvature axis, whereas the second connector part includes a second contact surface with a second main curvature that defines a second main curvature axis. The second main curvature is matched to the first main curvature and the first contact surface contacts the second contact surface in an installed state. The connection apparatus includes at least part of a positioning device that acts on the first connector part and the second connector part, wherein the positioning device is designed to maintain a narrow gap between the first contact surface and the second contact surface in an adjustment state that exists prior to the installed state in a non-contact manner such that a compensating motion is possible between the first contact surface and the second contact surface about the first main curvature axis without the occurrence of any action of force between the first connector part and the second connector part resulting from the compensating motion.

According to a further aspect, the disclosure pertains to a method for connecting an optical module with a support structure, in particular for microlithography, in which the optical module is connected via a connection apparatus with the support structure. The connection apparatus includes at least one connection unit with a first connector part and a second connector part, the first connector part is connected with the optical module and the second connector part is connected with the support structure, the first connector part has a first contact surface with a first main curvature, that defines a first main curvature axis, the second connector part has a second contact surface with a second main curvature matched to the first main curvature, that defines a second main curvature axis, and the optical module and the support structure are brought closer to one another such that the first contact surface contacts the second contact surface in an installed state. In an adjustment state that exists prior to the installed state a narrow gap between the first contact surface and the second contact surface is maintained in a non-contact manner so that a compensating motion between the first contact surface and the second contact surface about the first main curvature axis is possible without the occurrence of any action of force between the first connector part and the second connector part resulting from the compensating motion.

According to a further aspect the disclosure pertains to an optical apparatus, in particular for microlithography, which includes an optical module, a support structure and a connection apparatus, wherein the connection apparatus includes a plurality of connection units. Each connection unit includes a module connector part connected with the optical module and a structure connector part connected with the support structure, which contact each other in the installed state. The connection apparatus includes at least one part of a positioning apparatus, wherein the positioning apparatus is designed to reduce, in an adjustment state that exists prior to the installed state, a gap between the respective module connector part and the assigned structure connector part in a non-contact manner in such a way that the module connector parts and the assigned structure connector parts contact each other substantially simultaneously.

According to a further aspect, the disclosure pertains to a method for connecting an optical module with a support structure, in particular for microlithography, in which the optical module is connected via a connection apparatus with the support structure, wherein the connection apparatus includes a plurality of connection units, each connection unit includes a module connector part connected with the optical module and a structure connector part connected with the support structure. The optical module and the support structure are brought closer to one another so that the respective module connector part and the assigned structure connector part contact in an installed state. In an adjustment state that exists prior to the installed state, a gap that exists in each case between the respective module connector part and the assigned structure connector part is reduced in a non-contact manner so that the module connector parts and the assigned structure connector parts contact each other substantially simultaneously.

Further preferred embodiments of the disclosure result from the dependent claims or the following description of preferred exemplary embodiments which refers to the attached drawings.

DETAILED DESCRIPTION

First Embodiment

By reference to FIGS. 1 to 3 in the following a description is provided of a preferred embodiment of the optical apparatus, which is used in an optical imaging device 101 according to the disclosure for microlithography.

Figure 1:
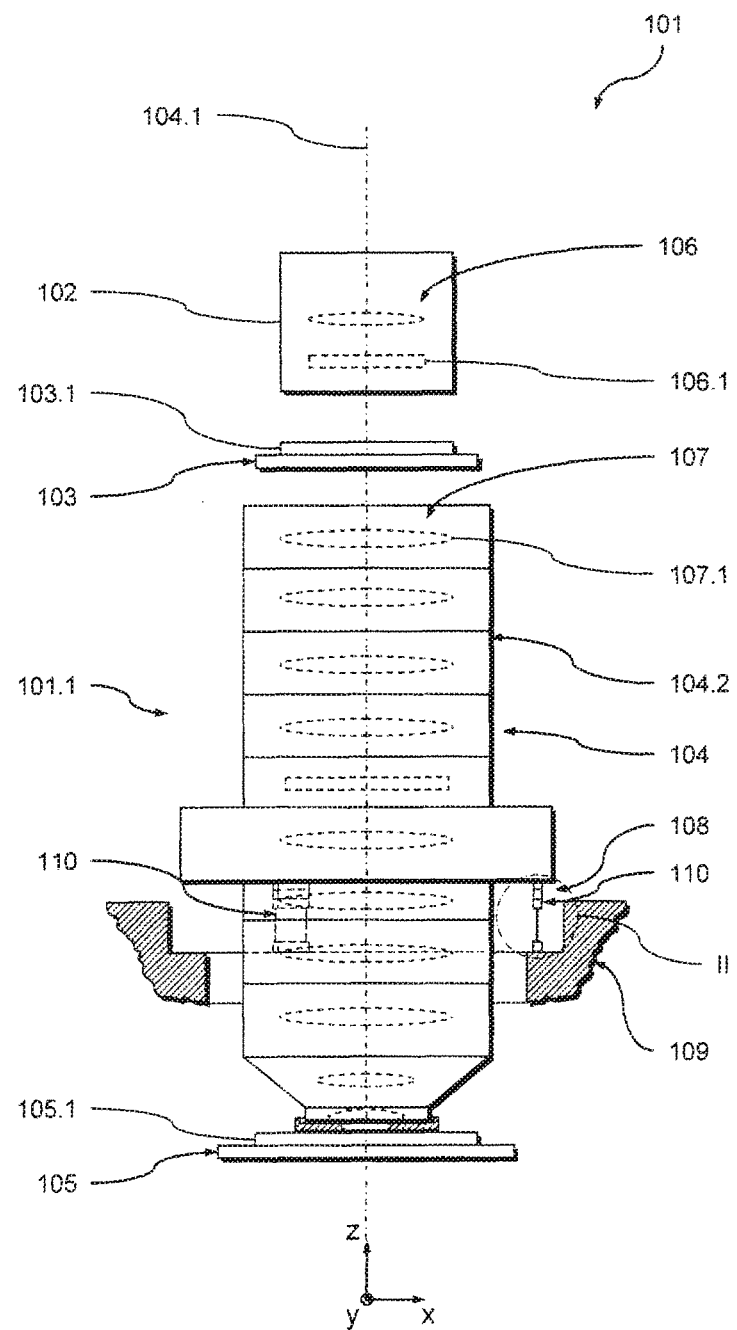
FIG. 1 is a schematic representation of a preferred embodiment of the optical imaging device according to the disclosure, including an optical apparatus according to the disclosure and with which a preferred embodiment of a method according to the disclosure for connecting two components of an optical apparatus may be executed.
Figure 2A:
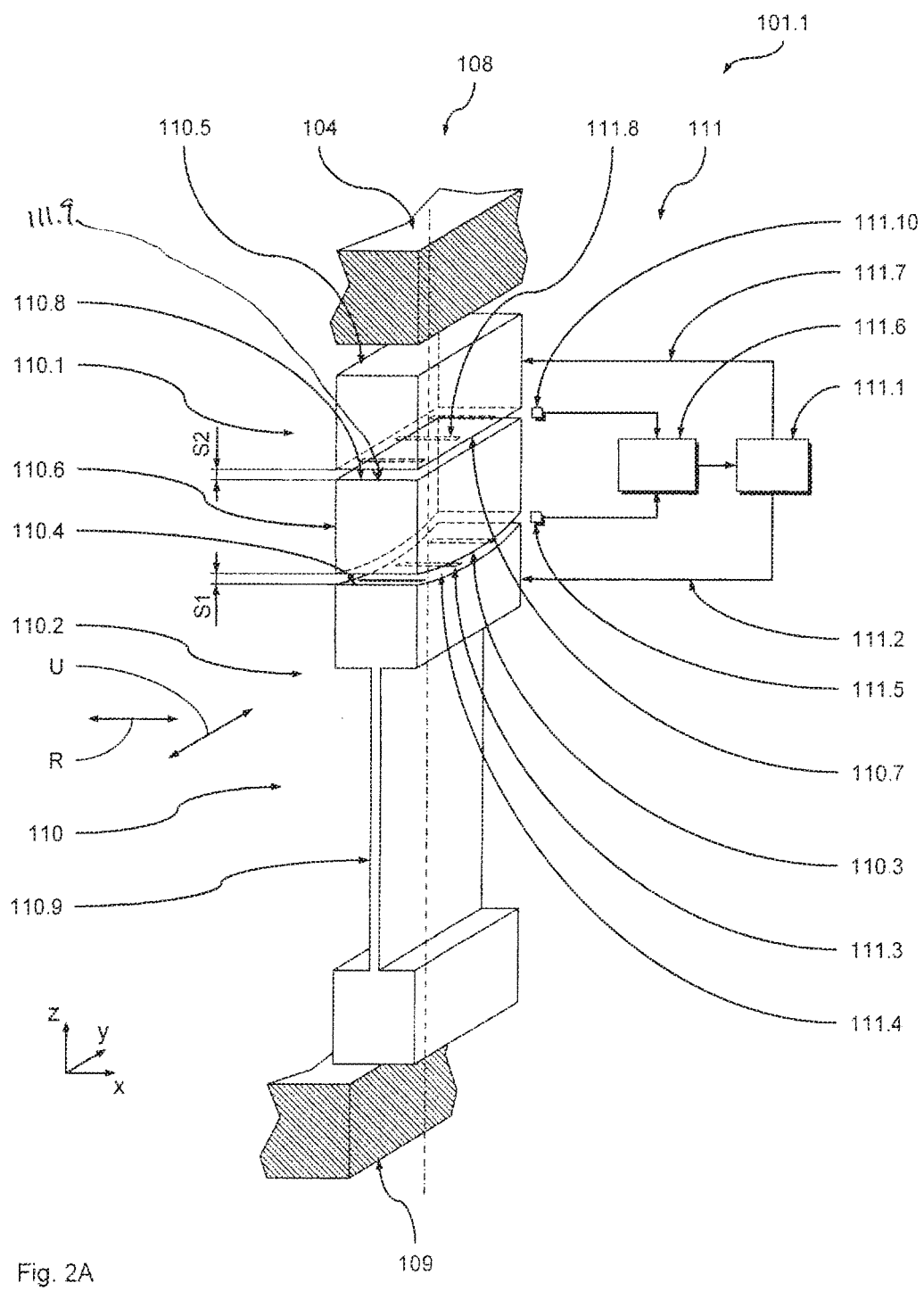
FIG. 2A is a schematic perspective view of part of a preferred embodiment of the optical apparatus according to the disclosure of the imaging device from FIG. 1 (detail II from FIG. 1) in an adjustment state.
Figure 2B:
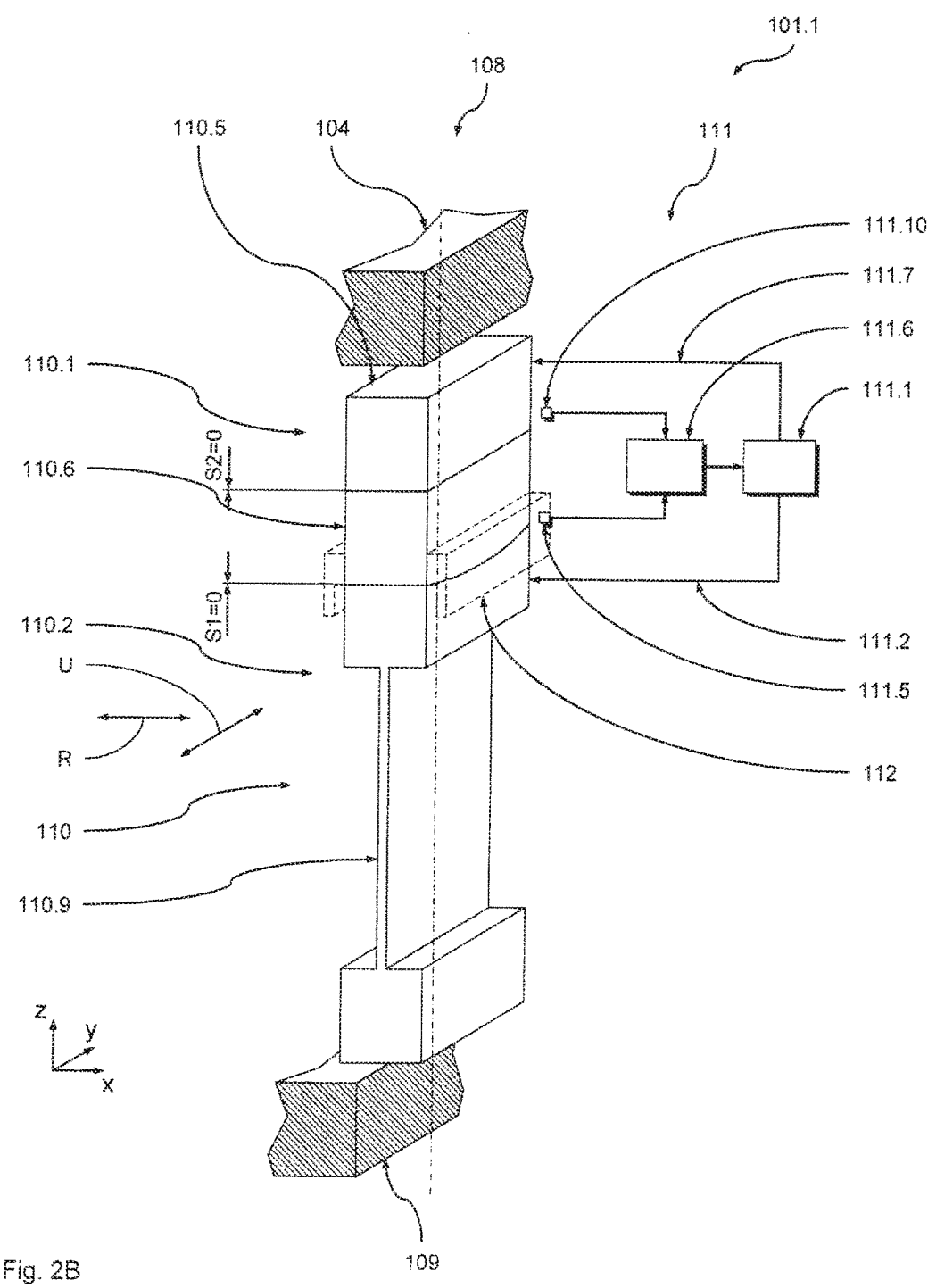
FIG. 2B is a schematic representation of the components from FIG. 2A in an installed state.
Figure 3:
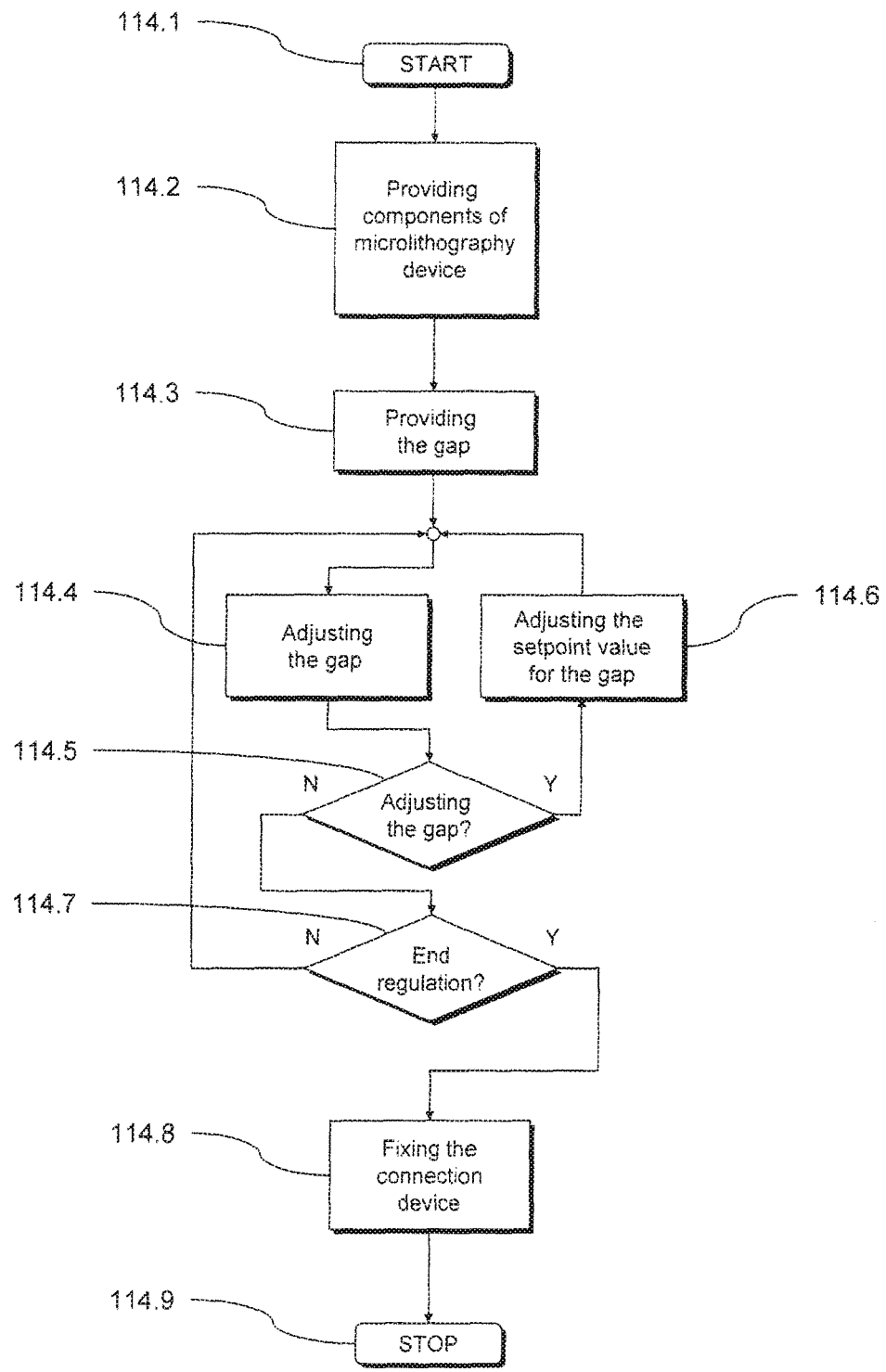
FIG. 3 is a block diagram of a preferred embodiment of the method according to the disclosure for connecting two components of an optical apparatus, which can be performed with the optical apparatus from FIG. 2A.

To simplify the explanation here reference is made to the xyz coordinate system shown in FIGS. 1, 2A and 2B, wherein it is assumed that the force of gravity is exerted parallel to the z-axis. It goes without saying, however, that in other variants of the disclosure another alignment of the components of the imaging device 101 may possibly apply.

FIG. 1 shows a schematic representation of a preferred embodiment of the optical imaging device according to the disclosure in the form of a microlithography apparatus 101, which works with UV light having a wavelength of 193 nm.

The microlithography apparatus 101 includes an illumination system 102, a mask apparatus in the form of a mask table 103, an optical projection system in the form of an objective 104 with an optical axis 104.1 (running in the z-direction) and a substrate apparatus in the form of a wafer table 105. The illumination system 102 illuminates a mask 103.1 arranged on the mask table 103 with a projection light beam—not shown in more detail—having a wavelength of 193 nm. On the mask 103.1 there is a projection pattern which is projected, with the projection light beam via the optical elements arranged in the objective 104, onto a substrate in the form of a wafer 105.1, arranged on the wafer table 105.

The illumination system 102 includes, in addition to a light source—not shown—a first group 106 of optically effective components including, among other things, an optical element 106.1. The objective 104 includes a second group 107 of optically effective components, which inter alia include a series of optical elements, for example the optical element 107.1. The optically effective components of the second group 107 are retained in the housing 104.2 of the objective 104. Due to the working wavelength of 193 nm, the optical element 106.1 or 107.1 may in each case be a refractive optical element, such as a lens or similar. It goes without saying, however, that with other variants of the disclosure optional other optical elements, such as refractive or diffractive optical elements may also be used. Similarly, of course, any combination of such optical elements may also be used.

The objective 104 is connected via a connection apparatus 108 with a support structure 109 and is thus supported by this supporting structure 109, wherein the objective 104, the connection apparatus 108 and the support structure 109 are components of the optical device 101.1 within the meaning of the present disclosure.

The connection apparatus 108 fixes the objective 104 in relation to the support structure 109 and transfers the weight of the objective 104 to the support structure 109. To this end the connection apparatus 108 includes three identically built connection units 110 evenly distributed in the circumferential direction U of the objective 104.

FIGS. 2A and 2B show in each case a partially cut-away, schematic perspective representation of one of the connection units 110 in an adjustment state (FIG. 2A) or an installed state (FIG. 2B), respectively. As may be inferred from FIG. 2A, the connection unit 110 includes a first connector part 110.1 (module connector part) and a second connector part 110.2 (structure connector part). The first connector part 110.1 at its end facing away from the support structure 109 is solidly connected (in a suitable manner) with the housing 104.2 of the objective 104, whereas the second connector part 110.2 at its end facing away from the objective 104 is solidly connected (in a suitable manner) with the support structure 109. The respective connection can be created in any suitable manner (frictional connection, form fit, material connection or any combination of these), and in particular a monolithic design can be selected in each case here.

At its end facing towards the support structure 109 the first connector part 110.1 has a first contact surface 110.3, whereas the second connector part 110.2 at its end facing towards the objective 104 has a second contact surface 110.4. The second contact surface 110.4 is matched to the first contact surface 110.3 so that they both have identical main curvatures.

The first contact surface 110.3 and the second contact surface 110.4 in the present example in each case is a simple, curved, cylindrical surface. The first contact surface 110.3 thus has a (first) main curvature $K_{1\text{-}1}$, whereas the second contact surface 110.4 has a (second) main curvature $K_{2\text{-}1}$, for which the following applies:

$$K_{1\text{-}1} = K_{2\text{-}1} \neq 0. \tag{1}$$

The main curvature $K_{1\text{-}1}$ is selected so that it defines a (first) main curvature axis $AK_{1\text{-}1}$, running in the radial direction R of the objective 104 (parallel to the xy-plane). Similarly the main curvature $K_{2\text{-}1}$ defines a (second) main curvature axis $AK_{2\text{-}1}$, running in the radial direction R of the objective 104 (parallel to the xy-plane).

Furthermore, the first contact surface 110.3 accordingly has a further main curvature $K_{1\text{-}2}$, whereas the second contact surface 110.4 has a further main curvature $K_{2\text{-}2}$, for which the following applies:

$$K_{1\text{-}2} = K_{2\text{-}2} = 0 \tag{2}$$

The main curvature $K_{1\text{-}2}$ is again selected so that it defines a further main curvature axis $AK_{1\text{-}2}$ lying at infinity, running parallel to the circumferential direction U of the objective 104 (parallel to the xy plane). Similarly the main curvature $K_{2\text{-}2}$ defines a further main curvature axis $AK_{2\text{-}2}$ lying at infinity, and likewise running parallel to the circumferential direction U of the objective 104 (parallel to the xy plane).

It goes without saying, however, that with other variants of the disclosure it can also be envisaged that the first and second contact surfaces are designed as multi-curved surfaces or as flat surfaces. It also goes without saying that the (first) main curvature axis $AK_{1\text{-}1}$ can run slightly inclined towards the radial plane of the objective 104 (xy plane), in order to achieve self-centering during installation. Depending on the desired centering effect, the angle of inclination is in particular between 0 mrad and 10 mrad. This allows to avoid that all the main curvature axes of the connection apparatus run parallel to one another and, hence, that the desired centering effect is achieved.

This design of the first contact surface 110.3 and of the second contact surface 110.4 has the result that, in the installed state shown in FIG. 2B, these make full surface contact so that a stable mechanical connection between the first connector part 110.1 and the second connector part 110.2 is guaranteed.

In order to create a solid mechanical connection between the first connector part 110.1 and the second connector part 110.2 (in the area of the first and second contact surfaces 110.3, 110.4) any suitable means can basically be used. In this way the (detachable or non-detachable) fixing of the connection can be achieved via a form fit, a frictional fit or a material connection or any combination of these.

As can also be inferred from FIGS. 2A and 2B, the first connector part 110.1 also has a first connector element 110.5 and a second connector element 110.6. The first connector element 110.5 at its end facing away from the support structure 109 is solidly connected (in a suitable manner) with the housing 104.2 of the objective 104, whereas the second connector element 110.6 at its end facing away from the objective 104 forms the first contact surface 110.3.

At its end facing towards the support structure 109 the first connector element 110.5 has a third contact surface 110.7, whereas the second connector element 110.6 at its end facing towards the objective 104 has a fourth contact surface 110.8.

The fourth contact surface 110.8 is matched to the third contact surface 110.7 so that they both have identical main curvatures.

The third contact surface 110.7 and the fourth contact surface 110.8 in the present example is in each case a flat surface. The third contact surface 10.7 thus has (in each normal section) a (third) main curvature $K_{3\text{-}1}$, whereas the fourth contact surface 110.8 (in each normal section) has a (fourth) main curvature $K_{4\text{-}1}$, for which the following applies:

$$K_{3\text{-}1} = K_{4\text{-}1} = 0 \tag{3}$$

The main curvature $K_{3\text{-}1}$ thus defines a main curvature axis $AK_{3\text{-}1}$ lying at infinity parallel to the xy plane, whereas the main curvature $K_{4\text{-}1}$ defines a further main curvature axis $AK_{4\text{-}1}$ lying at infinity parallel to the xy plane.

It goes without saying here as well, however, that with other variants of the disclosure it can also be envisaged that the third and fourth contact surfaces are single- or multi-curved surfaces.

This design of the third contact surface 110.7 and of the fourth contact surface 110.8 again has the result that, in the installed state shown in FIG. 2B, these make full surface contact so that a stable mechanical connection between the first connector element 110.5 and the second connector element 110.6 is guaranteed.

In order to create a solid mechanical connection between the first connector element 110.5 and the second connector element 110.6 (in the area of the first and second contact surfaces 110.7, 110.8) again any suitable means can basically be used. In this way the (detachable or non-detachable) fixing of the connection can be achieved via a form fit, a frictional fit or a material connection or any combination of these.

In the creation of the installed state as shown in FIG. 2B, i.e. when creating the connection between the objective 104 and the support structure 109, with conventional devices, due to various influencing factors, frictional relative movements between the joint partners (first and second connector parts or first and second connector elements, respectively) may arise.

As a result of shape and/or position tolerances of the components of the connection units 110 even with a precise lowering of the objective 104 along the z-axis onto the support structure 109 the respective contact surfaces of the connection units 110 may come into contact with each other at different points in time. A similar scenario can arise with an ideal location and shape of the components of the connection units 110, if the lowering of the objective 104 onto the support structure does not take place accurately along the Z-axis and/or with an inclination to the Z-axis.

In all these cases, with conventional designs it may, for example, arise that the contact surfaces of one of the connection units 110 already contact one another, whereas between the contact surfaces of at least one of the other contact units 110 there is still no contact. In creating the outstanding contacts for these other connection units 110 in the area of the contact surfaces already in contact a frictional relative movement is involved which leads to the introduction of undesired parasitic stresses into the objective 104.

In order to avoid, at least substantially, during creation of the connection between the objective 104 and the support structure 109, such frictional relative movements between the joint partners involved, the optical apparatus according to the disclosure 101.1 has a positioning device 111, the design and functioning of which are explained further in the following.

The positioning device 111 includes a power generation device with a fluid source 111.1, which is connected via a first fluid line 111.2 with first feed openings 111.3 formed in the second contact surface 110.4 of the second connector part 110.2. Via the fluid line 111.2 the fluid source 111.1 delivers a defined flow of a fluid (i.e. a gas and/or a liquid) in the area of the first contact surface 110.3 and the second contact surface 110.4. If the fluid is fed via the fluid line 111.2 in sufficient quantity and with sufficient pressure, via the first contact surface 110.3 a sufficiently large force is exerted on the objective 104 such that the first contact surface 110.3 lifts off from the second contact surface 110.4, and between the first contact surface 110.3 and the second contact surface 110.4 a defined narrow first gap 111.4 with a dimension S1 results.

In other words, therefore, in the area of the first contact surface 110.3 and the second contact surface 110.4 a hydrostatic or aerostatic bearing can be created through which a narrow first gap 111.4 with a specifiable dimension S1 can be set.

The working fluid used can basically be any suitable fluid, which is suitable for the respective application. In the present example clean room compressed air (thus corresponding to purified or treated air) can be used, in order to introduce the minimum possible amount of contamination into the system. It goes without saying, however, that with other variants of the disclosure any other gases, in particular inert gases, can be used as the working fluid.

The relevant dimension S1 of the first gap 111.4 can basically be defined in any suitable manner. In the present example it is the distance measured in the direction of the gravitational force (z-direction) between the first contact surface 110.3 and the second contact surface 110.4. It goes without saying, however, that the dimension S1 of the first gap can also be defined differently with other variants of the disclosure. For example, the distance measured vertically to the first contact surface between the first contact surface and the second contact surface may be used.

The dimension S1 of the first gap 111.4 can be set via the fluid dynamics state (pressure and speed of flow) of the fluid passed through the first fluid line 111.2. In order to set a first gap 111.4 with a precisely defined dimension S1, the positioning device 111 includes a first sensor device 111.5 which detects a variable that is representative of the actual dimension S1 and passes this to a control device 111.6 of the positioning device 111.

The sensor device 111.5 can basically be designed in any suitable manner in order to detect a variable representative of the actual dimension S1. Here, the sensor device 111.5 can apply any operating principle (e.g. an electrical, magnetic, optical or fluid dynamics operating principle or any combinations of these). In the present example capacitive sensors are particularly easy to implement in the area of the contact surfaces 110.3 and 110.4. A fluid dynamics sensor is similarly easy to implement, which detects one or more fluid dynamics variables of the flow in the area of the gap 111.4. For example, it is particularly simple to detect the pressure in the fluid in the area of the gap 111.4 from which the actual dimension S1 can then be inferred.

The control device 111.6 compares the actual dimension S1 with a setpoint value $S1_s$ for the dimension of the first gap 111.4 and provides a corresponding first control signal to the fluid source 111.1. Depending on this first control sign in al the fluid source 111.1 then sets the status parameters of the fluid flow passed through the first fluid line 111.2, in order to approximate the actual dimension of the first gap 111.4 to the setpoint value $S1_s$.

In the present example in an adjustment state, initially a first gap 111.4 with a dimension S1 of approximately 10 μm is set. It goes without saying, however, that with other variants of the disclosure a different dimension may also be selected. In particular the dimension S1 can be in the range between 5 μm and 15 μm.

In this adjustment state, therefore, a non-contact state prevails between the first connector part 110.1 and the second connector part 110.2, so that in other words in the area of the first contact surface 110.3 and the second contact surface 110.4 a kind of fluid bearing (in the present example an aerostatic bearing) is created. In this state, without a mechanical connection between the support structure 109 and the objective 104 transferring forces and moments, a force is applied in a non-contact fashion, which maintains the first gap 111.4 between the first connector part 110.1 and the second connector part 110.2. In this state between the first connector part 110.1 and the second connector part 110.2 compensating motions occur, without a frictional relative movement between the first contact surface 110.3 and the second contact surface 110.4 taking place.

The fluid fed into the area of the first gap 111.4 is in the present example a gas. This has the advantage that as a result of the low viscosity and thus lower internal friction of the gas only particularly low, as a rule insignificant, shearing forces can be transferred between the first contact surface 110.3 and the second contact surface 110.4. It goes without saying, however, that with other variants of the disclosure a liquid or a mixture of gas and liquid can be used, provided that the viscosity-induced influences are negligible.

In the area of the first gap 111.4 unrestricted compensating motions in two degrees of freedom are possible here, namely a rotational motion (here a swivelling movement) about the (first) main curvature axis $AK_{1-1}$ of the first contact surface 110.3 in line with the radial direction R of the objective 104, and a translational motion along this main curvature axis $AK_{1-1}$ (which ultimately is a special case with a motion about the further main curvature axis $AK_{1-2}$ of the first contact surface 110.3 lying at infinity).

Maintenance of the narrow first gap 111.4 has the advantage that the relative movements described above between the joint partners of the individual connection unit 110, which can occur when creating the connection between the objective 104 and the support structure 109 (as a result of production inaccuracies and/or deviations from the ideal line of the joint movement), do not lead to a (significant) frictional relative movement between the contact surfaces 110.3, 110.4.

The compensating motion about the main curvature axis $AK_{1-1}$ in line with the radial direction R has the advantage that a situation can be avoided in which the parasitic moments about this radial direction R resulting from an frictional relative motion cause, as a rule, particularly interfering parasitic stresses in the objective and therefore have a particularly interfering influence on the imaging quality of the objective.

As can further be inferred from FIGS. 2A and 2B, the positioning device 111 also includes a second fluid line 111.7 via which the fluid source 111.1 is connected with second feed openings 111.8, which are formed in the third contact surface 110.7 of the first connector element 110.5. Via the second fluid line 111.7 the fluid source 111.1 delivers a defined flow of a fluid (thus a gas and/or a liquid) in the area of the third contact surface 110.7 and the fourth contact surface 110.8. If the fluid is fed via the fluid line 111.2 in sufficient quantity and with sufficient pressure, via the third contact surface 110.7 a sufficiently large force is exerted on the objective 104 such that the third contact surface 110.7 lifts from the fourth contact surface 110.8, and between the third contact surface 110.7 and the fourth contact surface 110.8 a defined narrow second gap 111.9 with a dimension S2 results.

The relevant dimension S2 of the second gap 111.9 can again basically be defined in any suitable manner. In the present example it is the distance measured in the direction of the gravitational force (z-direction) between the third contact surface 110.7 and the fourth contact surface 110.8. It goes without saying, however, that the dimension S2 of the second gap again can also be defined differently with other variants of the disclosure (as with the first gap).

The dimension S2 of the second gap 111.9 can be set via the fluid dynamics state (pressure and speed of flow) of the fluid passed through the second fluid line 111.7. In order set a second gap 111.9 with a precisely defined dimension S2, the positioning device 111 includes a second sensor device 111.10 which detects a variable that is representative of the actual dimension S2 and passes this to a control device 111.6 of the positioning device 111. The second sensor device 111.10 can again be constructed like the first sensor device, so that in this connection reference is made the above statements.

The control device 111.6 compares the actual dimension S2 with a setpoint value $S2_s$ for the dimension of the second gap 111.9 and provides a corresponding second control signal to the fluid source 111.1. Depending on this second control signal the fluid source 111.1 then sets the status parameters of the fluid flow passed through the first fluid line 111.7, in order to approximate the actual dimension of the second gap 111.9 to the setpoint value $S2_s$.

In the present example in the adjustment state, apart from the first gap 111.4 a second gap 111.9 with a dimension S2 of approximately 10 µm is also set. It goes without saying, however, that with other variants of the disclosure a different dimension may also be selected. In particular the dimension S2 can also be in the range between 5 µm and 15 µm.

In this adjustment state, therefore, a non-contact state prevails between the first connector element 110.5 and the second connector element 110.6, so that in other words in the area of the first contact surface 110.7 and the fourth contact surface 110.8 a kind of fluid bearing (in the present example an aerostatic bearing) is created. In this state, without a mechanical connection between the support structure 109 and the objective 104 transferring forces and moments, a force is applied in a non-contact fashion, which maintains the second gap 111.9 between the first connector element 110.5 and the second connector element 110.6. In this state between the first connector element 110.5 and the second connector element 110.6 compensating motions occur, without a frictional relative movement between the third contact surface 110.7 and the fourth contact surface 110.8 taking place.

The fluid fed into the area of the second gap 111.9 in the present example again is a gas. This has the advantage that as a result of the low viscosity and thus lower internal friction of the gas only particularly low, as a rule insignificant, shearing forces can be transferred between the third contact surface 110.7 and the fourth contact surface 110.8. It goes without saying, however, that with other variants of the disclosure a liquid or a mixture of gas and liquid can be used, provided that the viscosity-induced influences are negligible.

In the area of the second gap 111.9 unrestricted compensating motions in three degrees of freedom are possible here, namely a rotational motion about an axis running in the direction of the gravitational force (z-axis) and two translational motions in a plane (xy-plane) perpendicular thereto (which ultimately is a special case with a movement about the further main curvature axes of the third contact surface 110.7 lying at infinity).

The two translational motions again include a compensating motion in the radial direction R of the objective 104, as is already possible also in the area of the first gap 111.4. It goes without saying, therefore, that with other variants of the disclosure it can also be envisaged that in the area of the first gap or the second gap via skirts or similar working in the radial direction R (as indicated in FIG. 2B by the dashed contour 112) this degree of freedom can be restricted.

Maintenance of the narrow second gap 111.9 likewise has the advantage that the relative movements described above between the joint partners of the individual connection unit 110, which can occur when creating the connection between the objective 104 and the support structure 109 (as a result of production inaccuracies and/or deviations from the ideal line of the joint movement), do not lead to a (significant) frictional relative movement between the contact surfaces 110.7, 110.8.

As can also be inferred from FIGS. 2A and 2B, the second connector part 110.2 of the respective connection unit 110 includes a flexible decoupling section in the radial direction R of the objective 104 in the form of a leaf spring element 110.9. The leaf spring element is aligned in such a way that its main plane of extension runs tangentially to the circumferential direction U of the objective 104. In the installed state (FIG. 2B) this leads on the one hand to a connection between the objective 104 guaranteed to be sufficiently rigid and to define the position of the objective 104 (relative to the support structure 109). Secondly, the decoupling section, in a sufficiently known manner through its deformation in the radial direction R (as indicated in FIG. 2B by the dashed contour 113), allows a balancing of the different thermal expansions between the objective 104 and the support structure 109.

A further advantage of the decoupling section 110.9 is that it allows a frictionless compensating motion between the first connector part 110.1 and the second connector part 110.2 about an axis running tangentially to the circumferential direction U, so that any inaccuracies in the fit between the first connector part 110.1 and the second connector part 110.2 in this plane can likewise be compensated in an advantageous manner.

An advantage of the configuration just described is that, when creating the connection between the objective 104 and the support structure 109, in the area of the respective connection unit 110 (irrespective of the joint direction along the z-axis) in the adjustment state (FIG. 2A), in which in each case the gap 111.4 or 111.9 achieved in a non-contact manner is present, in all other degrees of freedom non-frictional compensating motions are possible which allow the compensation of all production tolerances, so that in the subsequent installed state (FIG. 2B) undesired stress states between the joint partners and thus the introduction of parasitic stresses into the objective 104 do not occur.

In creating the connection between the objective 104 and the support structure 109 various strategies can be followed which are explained below with reference to FIGS. 1 to 3. FIG. 3 is a flow diagram of a preferred execution of the method according to the disclosure for connecting an optical module with a support structure according to which the connection between the objective 104 and the support structure 109 is created.

Initially the process sequence is started in a step 114.1. In a step 114.2 the components of the microlithography device 101 from FIG. 1, in particular the support structure 109 and the objective 104, are provided.

Then in a step 114.3 the objective 104 and the support structure 109 are positioned in relation to each other so that the configuration described above and shown in FIG. 2A with the first gap 110.4 of dimension S1 and the second gap 110.9 of dimension S2 results.

Here various strategies can be followed. Thus, in a first variant, the objective 104 can initially be placed in a first partial step without activation of the positioning device 111 on the support structure so that all the connection units 110 initially are in the state shown in FIG. 2B in which all contact surfaces assigned to one another 110.3 and 110.4 or 110.7 and 110.8 contact one another. With this placing of the objective 104 on the support structure 109 the frictional relative motions described above between the assigned contact surfaces 110.3 and 110.4 or 110.7 and 110.8 can occur.

In a second partial step, the positioning device 111 can be activated for all connection units 110, so that the respective first gap 110.4 and the second gap 110.9 are created in the connection unit concerned, as shown in FIG. 2A. As a result of the non-contact action of force between the support structure 109 and the objective 104, such that then the compensating motions between joint partners described above occur. In other words, the state initially created with possibly considerable parasitic forces and moments, which are introduced into the objective, is removed.

In a second variant the positioning device 111 can already be activated directly as the objective 104 is brought closer to the support structure 109, so that the individual gaps 110.4 and 110.9 are directly created and as a result initially no contact is made between the joint partners.

It also goes without saying of course that a mixed form of these two variants can be selected in which one or more of the connection units 110 are positioned according to the first variant, whereas one or more connection units 110 are positioned according to the second variant.

In a step 114.4 via the positioning device 111 in the respective connection unit 110 setting of the dimension S1 or S2 of the first gap 111.4 and the second gap 111.9, respectively, is carried out. Here, for the respective gap 111.4 or 111.9, in the manner described above, the actual dimension S1 or S2 is determined, compared in the control device 111.6 with a respective setpoint value $S1_S$ or $S2_S$ and influenced via the fluid source 111.1 in the desired manner, in order to adapt these to the respective setpoint value $S1_S$ or $S2_S$.

In a step 114.5 a check is then made if a change should be made to the respective gap 111.4 or 111.9. In this case, in a step 114.6, the respective setpoint value $S1_S$ or $S2_S$ is adapted according to the specifications with a subsequent return to step 114.4.

In this way it is possible in an advantageous manner to reduce the dimension S1 or S2 of gap 111.4 or 111.9, respectively, for the connection units 110 synchronously with one another. In particular it is possible in this way to achieve contacting with each other of the respective contact surfaces 110.3 and 110.4 or 110.7 and 110.8 of all connection units 110 at the same time. This substantially simultaneous contact creation has the result that no frictional relative motions between the contact surfaces 110.3 and 110.4 or 110.7 and 110.8 of the connection units 110 can occur. The result of this is that the state of affairs described above in which the contact surfaces 110.3 and 110.4 or 110.7 and 110.8 of a connection unit 110 have already contacted whereas the contact surfaces 110.3 and 110.4 or 110.7 and 110.8 of another connection unit 110 are still moving in relation to one another (which can result in frictional relative motions in the area of the contacts that are already in contact) is excluded.

In a step 114.7 a check is then made if the above regulation of the respective gap 111.4 or 111.9 should be ended, wherein the regulation is only ended if all contact surfaces 110.3 and 110.4 or 110.7 and 110.8 assigned to one another are contacting one another. If this is not the case there is a jump back to step 114.4.

Otherwise, in a step 114.8, in the manner described above there is a fixing of the respective connection apparatus 110 before the process sequence is ended in a step 114.9.

In the present example an standing support configuration with a positioning device has been described, which according to a fluidic operating principle generates in a non-contact manner an action of force between the support structure 109 and the objective 104, which counteracts a reduction in the respective gap 111.4 or 111.9 caused by other forces acting on the objective 104 (for example the weight of the objective 104).

It goes without saying, however, that with other variants of the disclosure a suspended support configuration can be envisaged, in which according to a fluidic operating principle in a non-contact manner an action of force between the support structure 109 and the objective 104 is generated, which counteracts an increase in the respective gap 111.4 or 111.9. In such a case it can, for example, be envisaged that the positioning device instead of the fluid source has a suction device, which in the area of the respective contact surfaces sucks away a corresponding flow volume, in order to achieve a suction action which counteracts the increase in the respective gap.

Second Embodiment

In the following, by reference to FIGS. 1 and 4, a further preferred exemplary embodiment of the optical apparatus 201.1 according to the disclosure is described. The optical apparatus 201.1 can be used in the microlithography device 101 from FIG. 1 instead of the optical apparatus 101.1. The optical apparatus 201.1, in its design and its functionality, basically corresponds to the optical apparatus 101.1 from the first embodiment, so that here the main focus will be on the differences. In particular, the same components are envisaged with the same reference numbers with these simply being increased by a value of 100. Unless stated to the contrary in the following, with respect to the characteristics and functions of these components reference is made to the above statements.

One difference between the optical apparatus 201.1 and the optical apparatus 101.1 is that the first connector part 210.1 of the respective connection unit 210 includes only the second connector element 210.6 which in this case has a direct mechanical connection with the objective 104. In other words with the optical apparatus 201.1, compared with the optical apparatus 101.1, all that is missing is the first connector element 110.5. Accordingly neither a second sensor device nor a second line is provided for.

Figure 4:
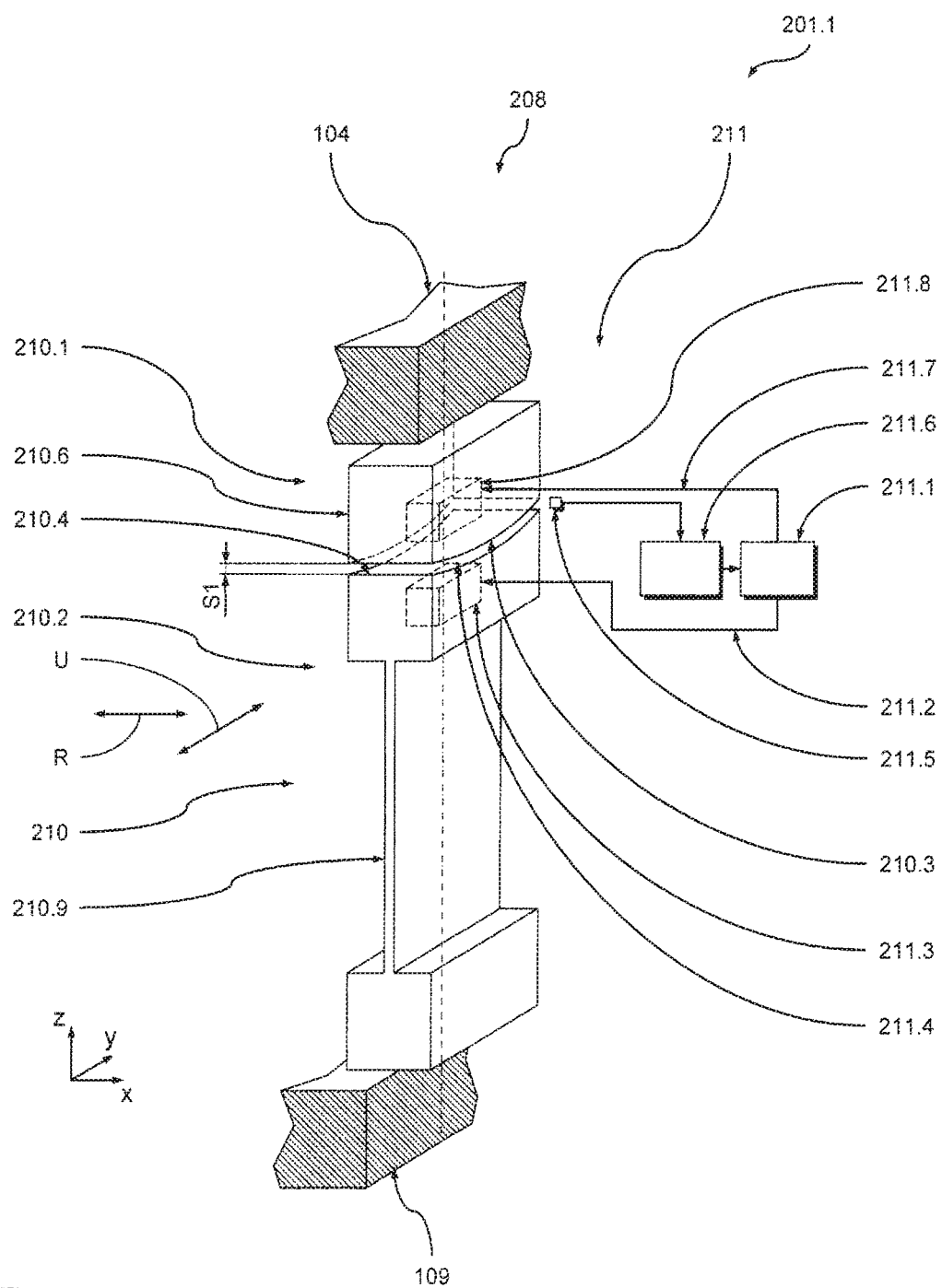
FIG. 4 is a schematic representation of a part of a further preferred embodiment of the optical apparatus according to the disclosure of the imaging device from FIG. 1.

With this design in the adjustment state shown in FIG. 4 via the gap 111.4 maintained in a non-contact manner, unrestricted compensating motions in two degrees of freedom are possible, namely a rotational motion (here a swivelling movement) about the (first) main curvature axis $AK_{1-1}$ of the first contact surface 210.3 in line with the radial direction R of the objective 104, and a translational motion along this main curvature axis $AK_{1-1}$ (which ultimately is a special case with a movement about the further main curvature axis $AK_{1-2}$ of the first contact surface 210.3 lying at infinity).

The decoupling section 201.9 within certain limits also allows a frictionless rotational compensating motion between the first connector part 210.1 and the second connector part 210.2 about an axis running tangentially to the circumferential direction U and about an axis running parallel to the gap direction (z-axis), so that any inaccuracies in the fit between the first connector part 210.1 and the second connector part 210.2 in these degrees of freedom can likewise be compensated in an advantageous manner within certain limits.

Ultimately, with this configuration in an advantageous manner, when creating the connection between the objective 104 and the support structure 109, in the area of the respective connection unit 210 (irrespective of the joint direction along the z-axis) in the adjustment state, in which the gap 111.4 achieved in a non-contact manner is present, frictionless compensating motions are possible in four degrees of freedom, allowing compensation of a majority of the production tolerances, so that in the subsequent installed state (not shown) undesired stress states between the joint partners are extensively avoided and thus the introduction of parasitic stresses into the objective 104 is extensively reduced.

A further difference from the optical apparatus 101.1 is that the positioning device 211 works according to an electromagnetic operating principle. To this end the positioning device 211 includes an electrical energy source 211.1, which is connected via a first energy supply line 211.2 with a first electromagnetic device 211.3, which is arranged in the area of the second contact surface 210.4 of the second connector part 210.2. The energy source 211.1 is also connected via a second energy supply line 211.7 with a second electromagnetic device 211.8, which is arranged in the second connector element 210.6 in the area of the first contact surface 210.3.

Via the energy supply line 211.2 the energy source 211.1 supplies, controlled by the control device 211.6, a defined quantity of electrical energy to the two electromagnetic devices, so that these generate magnetic fields with opposing polarities, which again in a non-contact manner generate a corresponding action of force between the objective 104 and the support structure 109 maintaining the gap 111.4.

The energy fed to the electromagnetic devices 211.3 and 211.8 and the resultant strength of the respective magnetic field can be used to set the dimension S1 of the gap 211.4. In order set a gap 211.4 with a precisely defined dimension S1, the positioning device 211 includes a sensor device 211.5 which detects a variable that is representative of the actual dimension S1 and passes this to the control device 211.6 of the positioning device 211.

The control device 211.6 again compares the actual dimension S1 with a setpoint value $S1_s$ for the dimension of the gap 211.4 and provides a corresponding control signal to the energy source 211.1. According to this control signal the energy source 211.1 then sets the energy supply, in order to approximate the actual dimension of the gap 211.4 to the setpoint value $S1_S$.

In the present example in the adjusting state illustrated, again initially a first gap 211.4 with a dimension S1 of approximately 10 µm is set. It goes without saying, however, that with other variants of the disclosure a different dimension (as a general rule a dimension of between 5 µm and 200 µm) can also be selected. In particular the dimension S1 can be in the range between 5 µm and 15 µm.

In this adjustment state, therefore, again a non-contact state prevails between the first connector part 210.1 and the second connector part 210.2, so that in other words in the area of the first contact surface 210.3 and the second contact surface 210.4 a kind of electromagnetic bearing is created. In this state, without a mechanical connection between the support structure 109 and the objective 104 transferring significant forces and moments, a force is applied in a non-contact fashion, which maintains the gap 111.4 between the first connector part 210.1 and the second connector part 210.2. In this state between the first connector part 210.1 and the second connector part 210.2 the compensating motions described above occur without a frictional relative movement between the first contact surface 210.3 and the second contact surface 210.4 taking place.

With this embodiment it is likewise possible to perform the method described above in connection with FIG. 3. Here in particular also, again controlled via the control device, through a corresponding reduction in the energy supply to the electromagnetic devices 211.3 and 211.8 at all the connection units 210, the gap 211.4 is synchronously reduced, until the respective first and second contact surfaces 210.3 and 210.4 contact substantially simultaneously with the advantages described above.

Here again it also goes without saying that, instead of the standing arrangement described, with the electromagnetic operating principle used in this example a suspended arrangement is also possible, in which via the magnetic fields an action of force is possible between the objective and the support structure which counteracts force that increases the gap between the two contact surfaces.

Third Embodiment

In the following, by reference to FIGS. 1 and 5, a further preferred embodiment of the optical apparatus 301.1 according to the disclosure is described. The optical apparatus 301.1 can be used in the microlithography device 101 from FIG. 1 instead of the optical apparatus 101.1. The optical apparatus 301.1, in its design and its functionality, basically corresponds to the optical apparatus 101.1 from the first exemplary embodiment, so that here the main focus will be on the differences. In particular, the same components are envisaged with the same reference numbers with these simply being increased by a value of 200. Unless stated to the contrary the following, with respect to the characteristics and functions of these components reference is made to the above statements.

One difference between the optical apparatus 301.1 and the optical apparatus 101.1 is that the first contact surface 310.3 and the second contact surface 310.4 in the present example each is a surface with a double curvature. The first contact surface 310.3 thus has a (first) main curvature $K_{1-1}$, whereas the second contact surface 310.4 has a (second) main curvature $K_{2-1}$, for which according to equation (1) the following applies:

$$K_{1-1} = K_{2-1} \neq 0.$$

The main curvature $K_{1-1}$ is selected so that it defines a (first) main curvature axis $AK_{1-1}$, running in the radial direction R of the objective 104 (parallel to the xy-plane). Similarly the main curvature $K_{2-1}$ defines a (second) main curvature axis $AK_{2-1}$ running in the radial direction R of the objective 104 (parallel to the xy-plane).

Consequently the first contact surface 310.3 also has a further main curvature $K_{1-2}$, whereas the second contact surface 310.4 has a further main curvature $K_{2-2}$ for which according to equation (1) the following likewise applies:

$$K_{1-2} = K_{2-2} \neq 0.$$

The main curvature $K_{1-2}$ is in turn selected so that it defines a further main curvature axis $AK_{1-2}$ running parallel to the circumferential direction U of the objective 104. Similarly the main curvature $K_{2-2}$ defines a further main curvature axis $AK_{2-2}$ which likewise runs parallel to the circumferential direction U of the objective 104 (parallel to the xy-plane).

The two main curvatures of the respective contact surfaces 310.3 or 310.4 can have different values. In the present example with the respective contact surfaces 310.3 and 310.4, however, it is a case of a spherical surface, where the following applies:

$$K_{1-1} = K_{2-1} = K_{1-2} = K_{2-2}.$$

Figure 5:
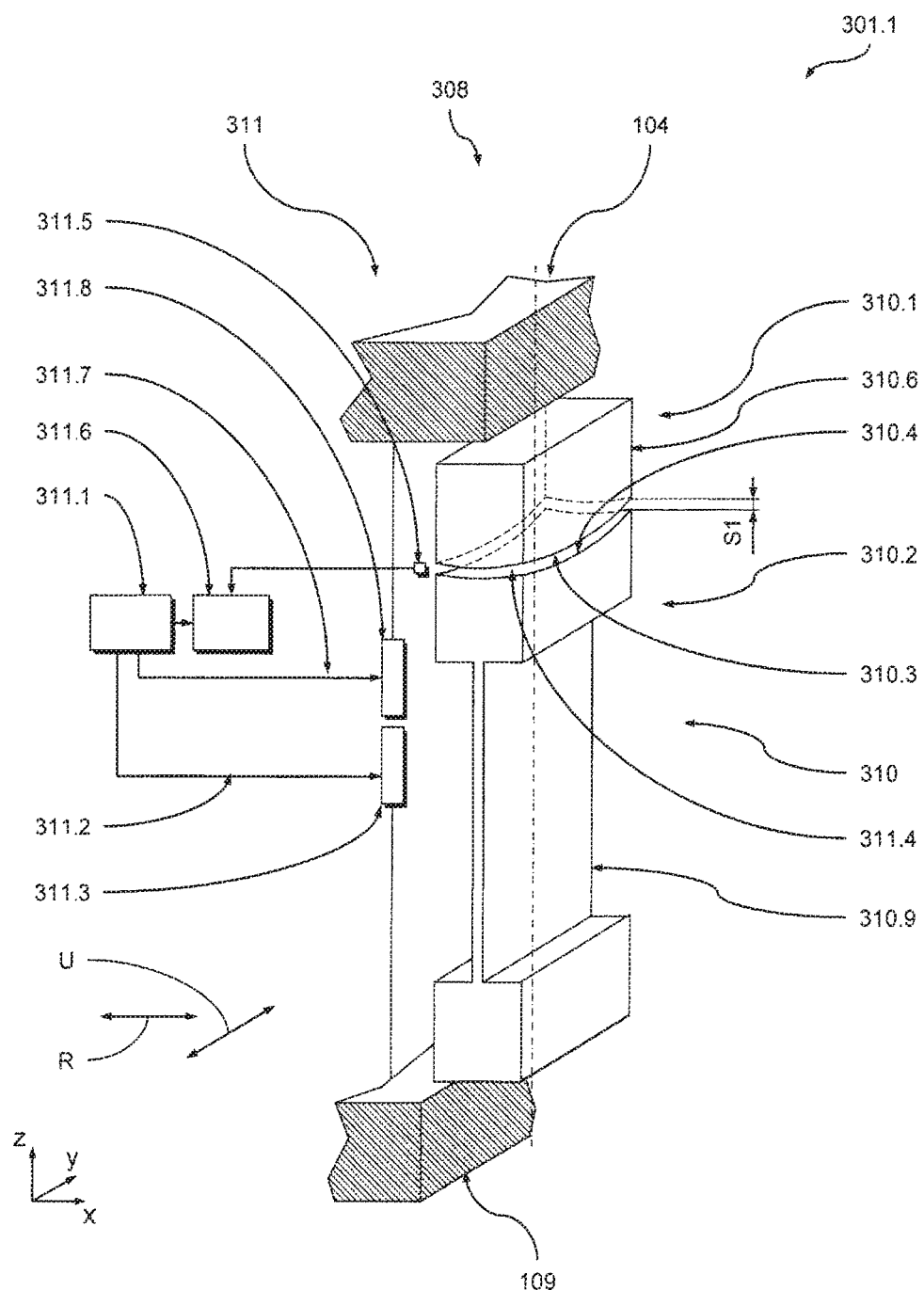
FIG. 5 is a schematic representation of a part of a further preferred embodiment of the optical apparatus according to the disclosure of the imaging device from FIG. 1.

With this design in the adjustment state shown in FIG. 5, due to the gap 311.4 maintained in a non-contact manner, unrestricted compensating motions are possible in three degrees of freedom, namely rotational motions about the three spatial axes (x-, y- and z-axis).

The decoupling section 310.9 also allows within certain limits an additional frictionless translational compensating motion in the radial direction R of the objective 104 so that any inaccuracies in the fit between the first connector part 310.1 and the second connector part 310.2 in this degree of freedom can likewise be compensated within certain limits in an advantageous manner.

Finally with this configuration in an advantageous manner when creating the connection between the objective 104 and the support structure 109 in the area of the respective connection unit 310 (irrespective of the joint direction along the z-axis) in the adjustment state in which the gap 311.4 created in a non-contact manner is present, compensating motions are possible in four degrees of freedom, which allow compensation of a majority of the production tolerances, so that in the subsequent installed state (not shown) undesired stress states between the joint partners are extensively avoided and thus the introduction of parasitic stresses into the objective 104 is extensively reduced.

A further difference from the optical apparatus 101.1 is that the force generation of the positioning device 311 is not integrated into the connection unit 110, but takes place via a force generation device 311.3, 311.8 arranged kinematically in parallel with the connection unit 310 (shown in a highly schematised manner in FIG. 5).

The force generation device 311.3 again works according to an electrical, magnetic or fluidic operating principle or any combination of these operating principles. Again it generates in a non-contact manner an action of force between the objective 104 and the support structure 109, by which the gap 311.4 between the first contact surface 310.3 and the second contact surface 310.4 is maintained.

With this exemplary embodiment it is likewise possible to perform the method described above in connection with FIG. 3. Here in particular again, under the control of the control device 311.6, through a corresponding reduction in the energy supply from the energy source 311.1 to the force generation device 311.3, 311.8 at all the connection units 310, the gap 311.4 is synchronously reduced until the respective first and second contact surfaces 310.3 and 310.4 contact substantially simultaneously with the advantages described above.

Here again it also goes without saying that, instead of the standing arrangement described, a suspended arrangement is also possible, in which via the force generation device an action of force is possible between the objective and the support structure which counteracts force that increases the gap between the two contact surfaces.

Fourth Embodiment

In the following, by reference to FIGS. 6 to 8b, a further preferred exemplary embodiment of the microlithography device 401.1 according to the disclosure with an optical apparatus 401.1 according to the disclosure is described. The microlithography device 401, in its design and functionality, basically corresponds to the microlithography device 101 from the first embodiment, so that here the main focus will be on the differences, which in the main concern the optical apparatus 401.1. The latter can furthermore also be used in the microlithography device 101 from FIG. 1 instead of the optical apparatus 101.1. The optical apparatus 401.1 corresponds in its design and its functionality basically to the optical apparatus 101.1 from the first embodiment, so that here the main focus will be on the differences. In particular, the same components are envisaged with the same reference numbers with these simply being increased by a value of 300. Unless stated to the contrary in the following, with respect to the characteristics and functions of these components reference is made to the above statements.

The difference between the optical apparatus 401.1 and the optical apparatus 101.1 merely consists of the design of the supporting of the objective 104 by the support structure 409, as can be inferred from FIGS. 6 to 8B, whereas the microlithography device 401 is otherwise identical in design to the microlithography device 101.

Figure 6:
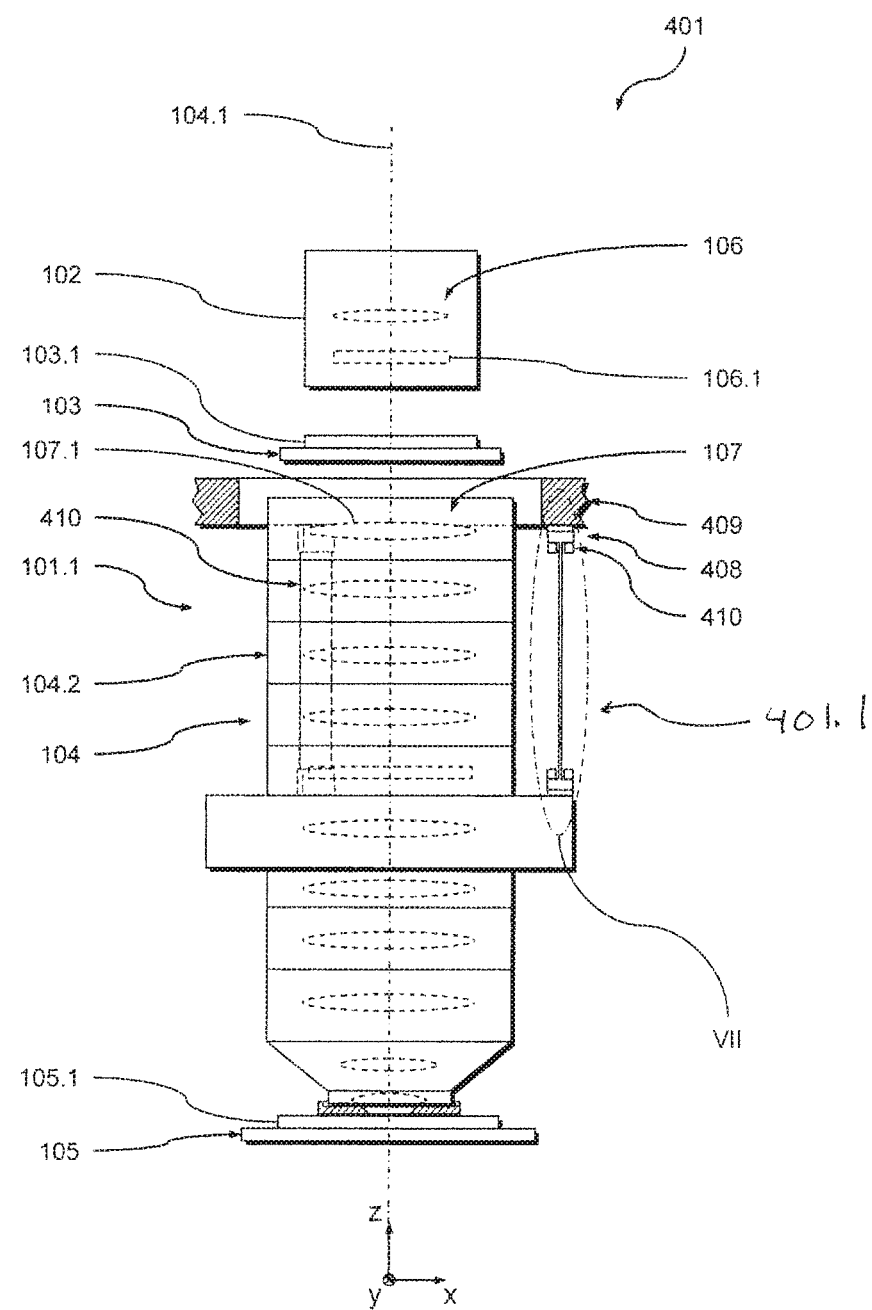
FIG. 6 is a schematic representation of a further preferred embodiment of the optical imaging device according to the disclosure, including an optical device according to the disclosure and with which a preferred embodiment of a method according to the disclosure for connecting two components of an optical device may be executed.

As can be inferred from FIG. 6, in particular, with the optical apparatus 401.1 the objective 104 is supported in a suspended manner, in that the objective is suspended via a connection apparatus 408 below the support structure 409 and is supported by the support structure in this way. To this end the connection apparatus 408 includes three identically designed connection units 410 evenly distributed in the circumferential direction U of the objective 104.

Figure 7:
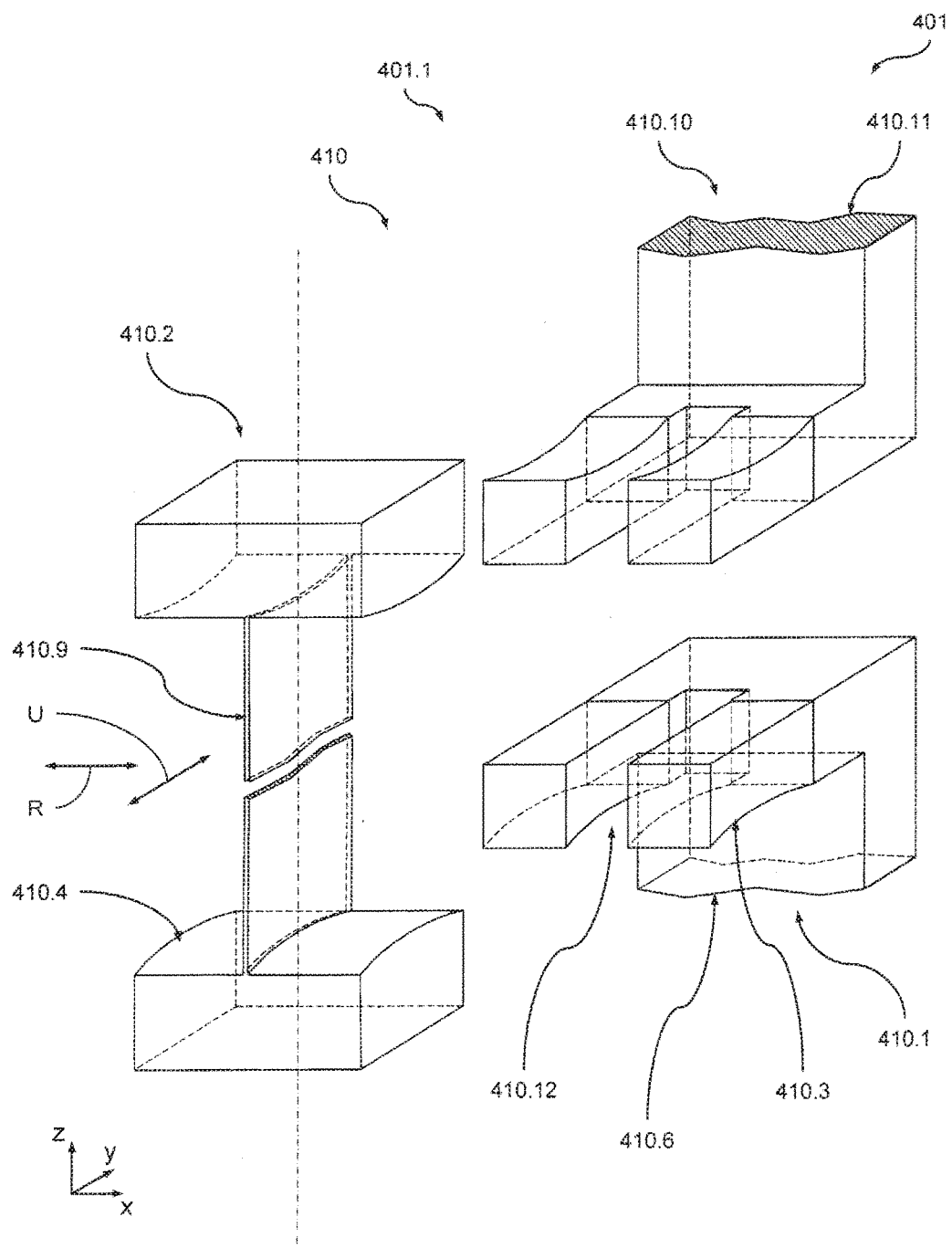
FIG. 7 is a schematic perspective view of part of a preferred embodiment of the optical apparatus according to the disclosure of the imaging device from FIG. 6 (detail VII from FIG. 6) in a not yet installed state.
Figure 8A:
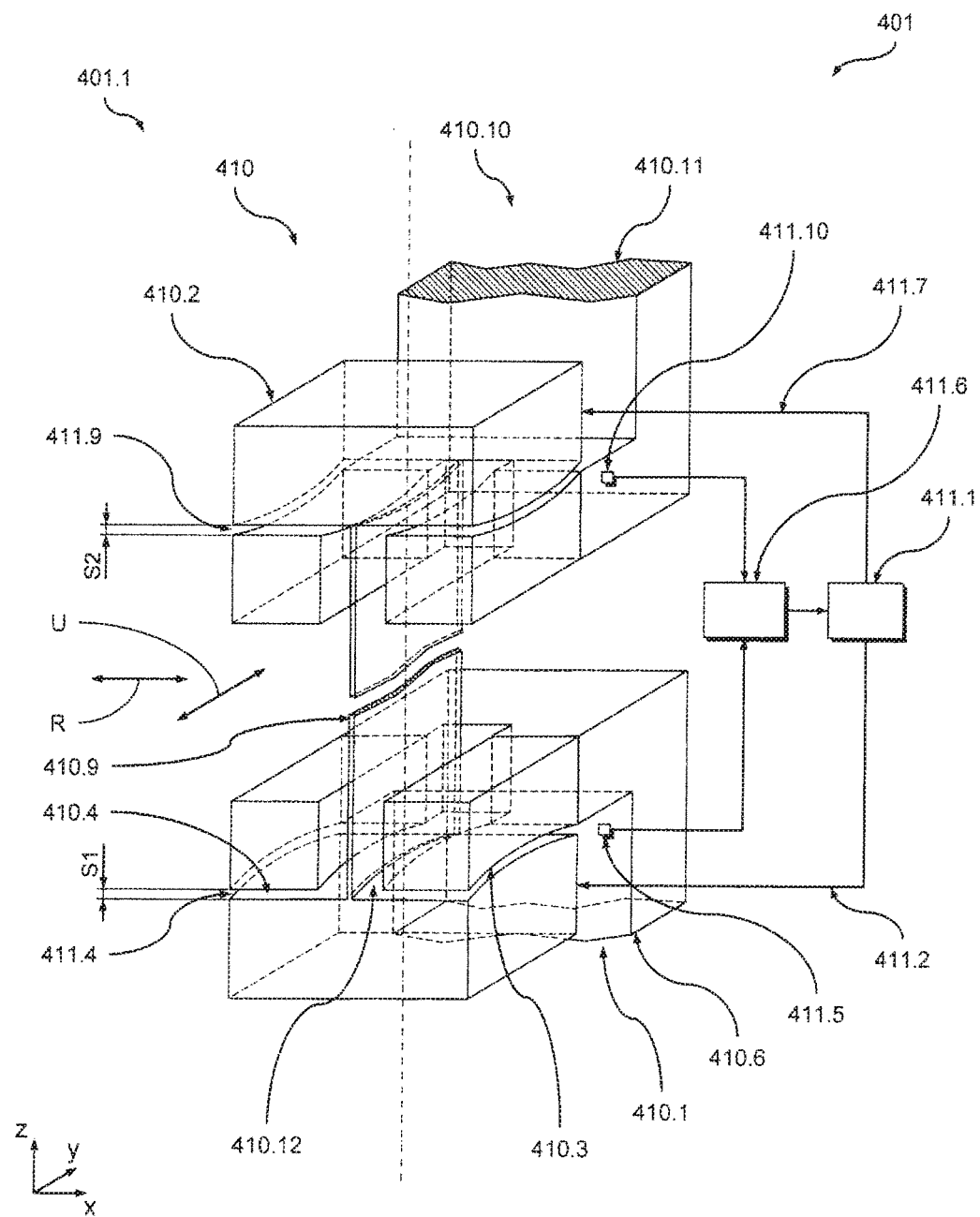
FIG. 8A is a schematic perspective view of the components from FIG. 7 in an adjustment state.
Figure 8B:
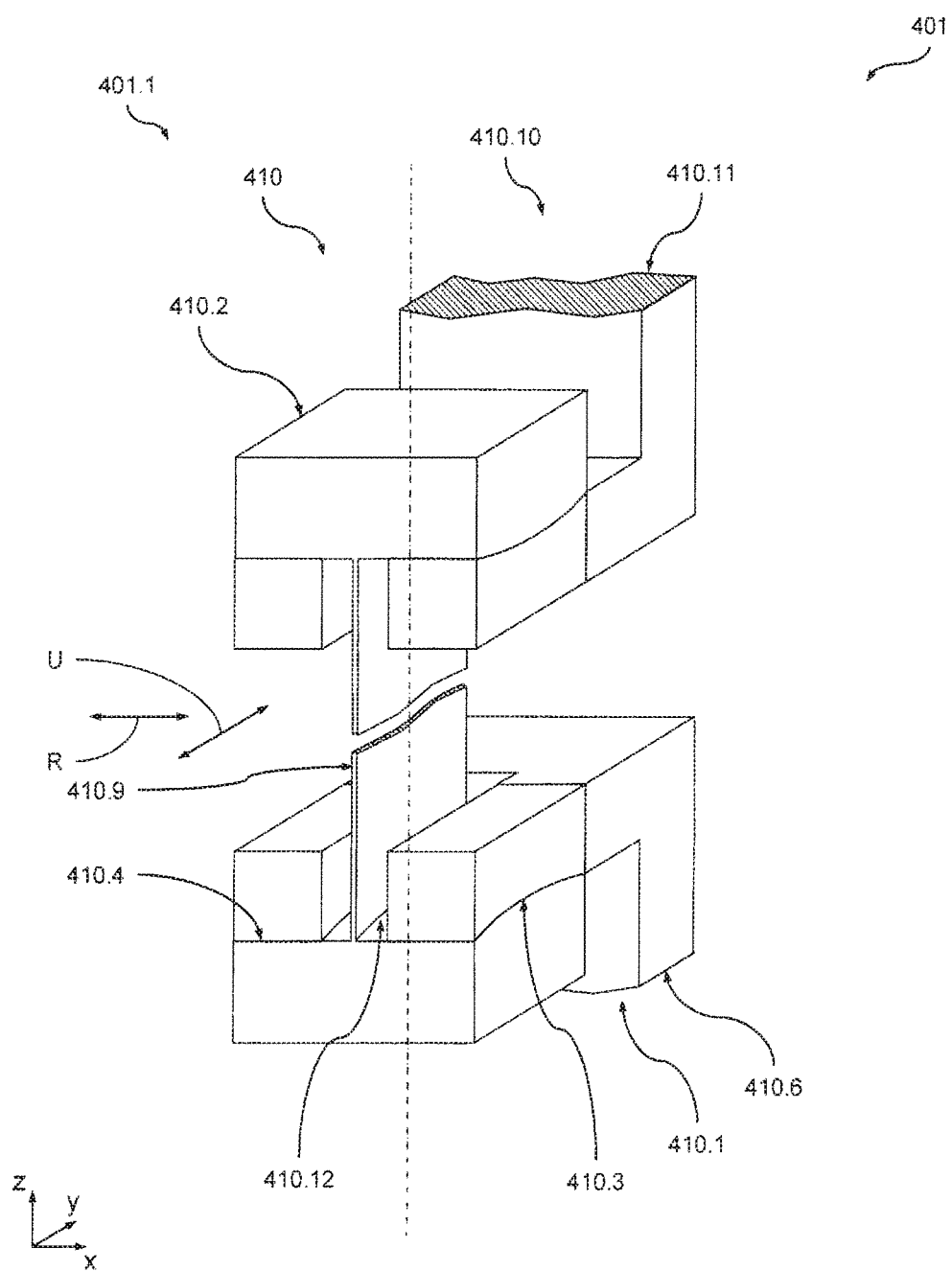
FIG. 8B is a schematic representation of the components from FIG. 8A in an installed state (detail VII from FIG. 6)

FIGS. 7, 8A and 8B show in each case a partially cut-away, schematic perspective representation of one of the connection units 410 in a non-installed state (FIG. 7), an adjustment state (FIG. 8A) and an installed state (FIG. 8B), respectively. As may be inferred from FIG. 8A, the connection unit 410 includes a first connector part 410.1, a second connector part 410.2 and a third connector part 410.10.

Here, the first connector part 410.1 of the respective connection unit 410 again includes just the second connector element 410.6 which in this case has a direct mechanical connection with the objective 104. The third connector part 410.10 includes a further connector element 410.11 which has an identical design to the second connector element 410.6, but is rotated by 180° in relation to the circumferential direction (or the y-direction). In the present example the connector element 410.11 has a direct mechanical connection with the support structure 409. The respective connection can be created in any suitable manner (frictional connection, form fit, material connection or any combination of these), and a monolithic design can be selected in particular in each case.

At its end facing towards the support structure 409 the first connector part 410.1 has a forked design, having a first contact surface 410.3, divided into two halves via a central indentation 410.12, facing away from the support structure 409. At its end facing away from the support structure 409 the second connector part 410.2 has a second contact surface 410.4 facing towards the support structure 409. The second contact surface 410.4 is divided into two halves by a flexible decoupling section in the form of a leaf spring element 410.9 arranged centrally in the radial direction R of the objective 104. In the manner described above in connection with the first to third embodiments, the second contact surface 410.4 is matched to the first contact surface 410.3 so that both have identical main curvatures.

At its end facing towards the support structure 409 the second connector part 410.2 has a design that is identical (to the design of the end facing towards the support structure 409) but rotated by 180° with regard to the circumferential direction U, so that the second connector part 410.2 in a similar manner can be coupled with the third connector part 410.10, in that their contact surfaces matched to each other can be placed against each other.

With this design it is accordingly possible, for example, to "hang" the respective second connector part 410.2 initially into the third connector part 410.10 (so that the second connector parts 410.2 consequently therefore hang in the support structure 409) and then to "hang" the objective 104 with the first connector parts 410.1 in the second connector parts 410.2 (so that the objective 104 consequently therefore is then hung over the second connecting parts 410.2 on the support structure).

Here the fork-shaped design of the connector parts 410.1 and 410.10 with the tangentially directed indents 410.2 allows a simple jointing or hanging through a rotation in the circumferential direction U.

The design of the respective first connector part 410.1 and the respective second connector part 410.2 also corresponds to the design of the first connector part 110.1 or the second connector part 110.2 described above in connection with the first embodiment. In particular the curvatures of the first contact surface 410.3 and the second contact surface 410.4 have identical designs to those of the first contact surface 110.3 and the second contact surface 110.4 respectively. Here also it goes without saying, however, that with other variants of the disclosure it can also be envisaged that the first and second contact surfaces are designed as multi-curved surfaces or as flat surfaces.

This design of the first contact surface 410.3 and of the second contact surface 410.4 also again has the result that, in the installed state shown in FIG. 8B, these make full surface contact so that a stable mechanical connection between the first connector part 410.1 and the second connector part 410.2 or between the second connector part 410.2 and the third connector part 410.10 is guaranteed.

In order to create a solid mechanical connection between the first connector part 410.1 and the second connector part 410.2 (in the area of the first and second contact surfaces 410.3, 410.4) any suitable means can basically be used. In this way the (detachable or non-detachable) fixing of the connection can be achieved via a form fit, a frictional fit or a material connection or any combination of these.

In the creation of the installed state as shown in FIG. 8B, i.e. when creating the connection between the objective 104 and the support structure 409 with conventional devices, due to various influencing factors, frictional relative movements between the joint partners (first and second connector parts or second and third connector parts) may arise. In order to prevent these frictional relative motions at least substantially, the optical apparatus 401.1 again has a positioning device 411 (only shown in FIG. 8a), the design and functionality of which substantially correspond to the variants described above, in particular the positioning device 111 from the first exemplary embodiment.

In the present example, similarly to the first embodiment, in the adjustment state (shown in FIG. 8A), apart from the first gap 411.4 a second gap 411.9 with a dimension S1=S2 of approximately 40 μm is set. It goes without saying, however, that with other variants of the disclosure a different dimension may also be selected. In particular the dimension S1 or S2 is in the range between 5 μm and 15 μm.

In this adjustment state, therefore, a non-contact state prevails between the second connector part 410.2 and the first connector part 410.1 or the third connector part 410.10, so that in other words in each case a kind of fluidic bearing (in the present example an aerostatic bearing) is created. In this state, without a mechanical connection between the support structure 409 and the objective 104 transferring significant forces and moments a force is applied in a non-contact fashion, which maintains the second gap 411.9 between the first connector element 410.5 and the second connector element 410.6. In this state between the first connector element 410.5 and the second connector element 410.6 compensating motions occur, without a frictional relative movement between the respective contact surfaces taking place.

As can further be inferred from FIGS. 7, 8A and 8B, the second connector part 410.2 of the respective connection unit 410 includes a flexible decoupling section in the radial direction of the objective 104 in the form of a leaf spring element 410.9. The leaf spring element is again aligned in such a way that its main plane of extension runs tangentially to the circumferential direction U of the objective 104. In the installed state (FIG. 8B) this leads firstly to a sufficiently rigid connection (in particular in the circumferential direction) accurately defining the position of the objective 104 (relative to the support structure 409) being guaranteed. Secondly, the decoupling section in a sufficiently known manner through its deformation in the radial direction R (as indicated in FIG. 2B by the dashed contour 413) allows a balancing of the different thermal expansions between the objective 104 and the support structure 409.

A further advantage of the decoupling section 410.9 is that it allows a frictionless compensating motion between the first connector part 410.1 or the third connector part 410.10 and the second connector part 410.2 about an axis running tangentially to the circumferential direction U, so that any inaccuracies in the fit between the first connector part 410.1 or the third connector part and the second connector part 410.2 in this plane can likewise be compensated in an advantageous manner.

In creating the connection between the objective 104 and the support structure 409 again various strategies can be followed as already explained above in connection with FIG. 3. Thus, in a first variant, the objective 104 can initially be hung in a first partial step without activation of the positioning device 411 in the support structure 409 so that all the connection units 410 initially are in the state shown in FIG. 2B in which all contact surfaces assigned to one another 410.3 and 410.4 contact one another.

In a second partial step, the positioning device 411 can then be activated for all connection units 410, so that the respective first gap 410.4 and the second gap 410.9 are created in the connection unit 410 concerned, as shown in FIG. 8A. As a result of the non-contact action of force between the support structure 409 and the objective 104 it is then a case here of the compensating motions between joint partners described above. In other words, the state initially created with possibly considerable parasitic forces and moments, which are introduced into the objective, is removed.

In a second variant, the positioning device 411 can already be activated directly when the objective 104 is hung in the support structure 409, so that the individual gaps 410.4 and 410.9 are directly created and as a result initially no contact is made between the joint partners. It also goes without saying of course that a mixed form of these two variants can also be selected in which one or more of the connection units 410 are positioned according to the first variant, whereas one or more connection units 410 are positioned according to the second variant.

In a step 414.4, via the positioning device 411, in the respective connection unit 410 setting of the dimension S1 or S2 of the respective first gap 411.4 and second gap 411.9 is carried out in the manner described above in connection with the first exemplary embodiment, whereby it is possible in an advantageous manner, to reduce the dimension S1 or S2 of the respective gap 411.4 or 411.9 for the connection units 410 synchronously to each other, so that in particular the respective contact surfaces 410.3 and 410.4 of all connection units 410 contact each other at the same time.

It goes without saying, however, that with other variants of the disclosure it can also be envisaged that with the respective connection unit 410 initially only the first gap 411.4 or the second gap 411.9 is reduced until the contact surfaces rest upon each other and only then is the respective other gap reduced until the contact surfaces rest upon each other.

Figure 9A:
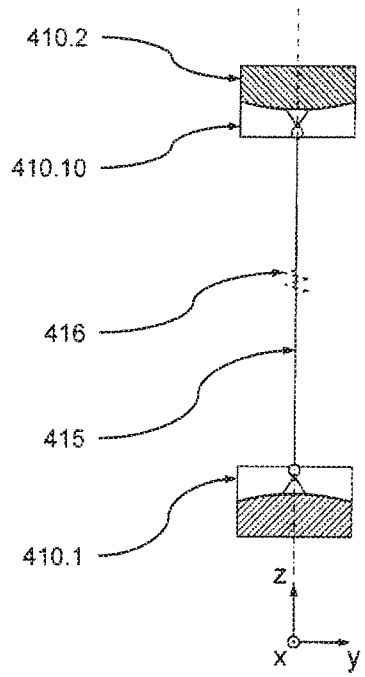
FIGS. 9A to 9D are in each case highly schematised representations of the components of further preferred embodiments of the optical apparatus according to the disclosure in an installed state.

It also goes without saying that, with other variants of the disclosure, as the connector element instead of the shear stiff leaf spring 410.9 in the circumferential direction U a simple rod element 415 is provided as shown in FIG. 9A. Here the connector element can be designed in its longitudinal direction to be substantially stiff or highly rigid. Likewise, however, the connector element can at least have a longitudinally soft or spring section with a low rigidity in its longitudinal direction, as shown in FIG. 9A by the dashed contour 416.

Figure 9B:
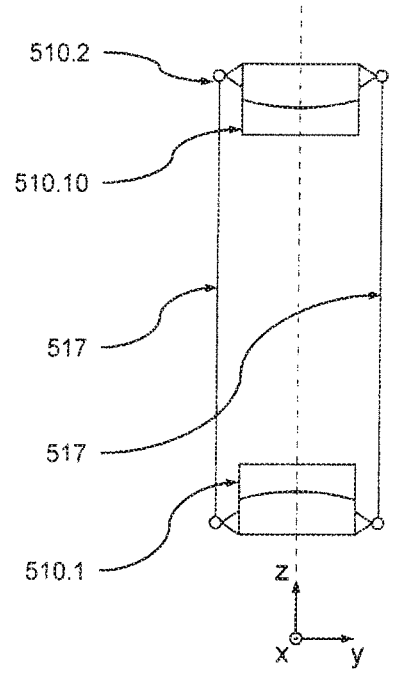

In further variants of the disclosure, instead of the fork-shaped design of the first or third connector part a design with undivided contact surfaces of the first connector part 510.1 or this connector part 510.10 can be envisaged, as shown, for example, in FIG. 9B. In this case then, for example, two (in the circumferential direction U) laterally arranged connector elements 517 are provided, which connect the two sections of the second connector part 510.2 forming the contact surfaces. These connector elements 517 can again have any design. Thus, they can for example have a forked design, as shown in FIG. 9B. Similarly again leaf springs can also be used.

Figure 9C:
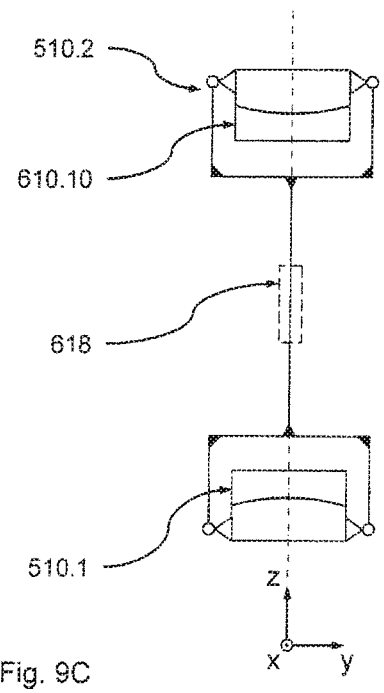

In a modification to these variants the connector element 617 of the second connector part 610.2 can have a forked design at both ends, in order to encompass the first connector part 510.1 or the third connector part 510.10, as shown in FIG. 9C.

In further variants of the disclosure in the area of the second connector part, for example, an actuator device can further be provided, as shown in FIG. 9C by the dashed contour 618. This actuator device 618 can serve to actively adjust a dimension of the second connector part, for example its length.

Figure 9D:
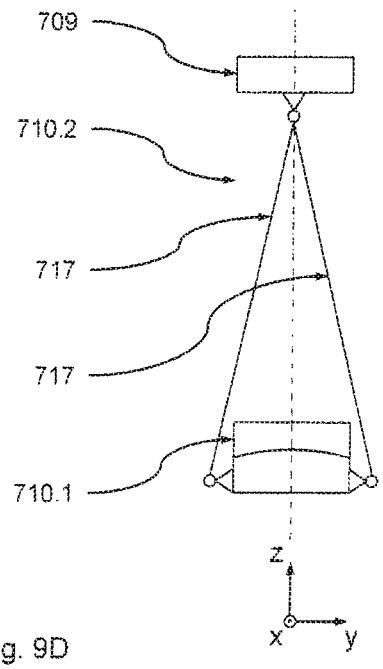

Finally, in further variants of the disclosure it can be provided that the third connector part (or the first connector part 710.1) is left out and the second connector part 710.2 (e.g. via two connector elements 717 arranged in the manner of a bipod) is directly connected with the support structure 709 (or the objective), as shown in FIG. 9D.

The disclosure has been described above using examples in which three connection units are provided for in each case. It goes without saying, however, that with other variants of the disclosure another number of connection units can be provided for. In particular, with a corresponding design of the second connector part, just two connection units also suffice, which are then offset by 180° to each other in the circumferential direction U of the objective. For this, designs are in particular suitable as shown in FIGS. 2A, 4, 5, 7, 9B, 9C and 9D which (in a corresponding design) have sufficient capacity to absorb a tilting moment in the radial direction R.

The disclosure has been described above using examples in which the optical module is an objective which is supported by a support structure. It goes without saying, however, that with other variants of the disclosure it can also be envisaged that another optical module is supported by an associated support structure. In particular it is possible that the optical module is formed merely by a single optical element alone or possibly together with a corresponding retaining device (for example a retaining ring or similar).

The disclosure has also been described above using examples in which the joint direction runs in the direction of the gravitational force. It goes without saying, however, that with other variants of the disclosure any other (in particular at an angle to the direction of the gravitational force) alignment of the joint direction and thus also of the respective contact surfaces can be provided for.

The disclosure has been described above using examples in which exclusively refractive optical elements have been used. At this point it is once again stated that the disclosure, in particular in the case of imaging at other wavelengths, can of course be used in association with optical apparatus which include refractive, reflective or diffractive optical elements alone or in any combination.

The disclosure has further been described above using examples in which an objective is exclusively connected to a support structure. It is stated at this point, however, that the disclosure can of course also be used in association with the supporting of other optically acting components of the imaging device, in particular components of the illumination device, the mask device and/or the substrate device.

Finally, it is pointed out that the present disclosure has been described above using examples from the area of microlithography. It goes without saying, however, that the present disclosure can likewise be used for any other applications or imaging methods, in particular at any wavelengths of the light used for the imaging.

What is claimed is:

1. An optical apparatus, comprising:
   an optical module;
   a support structure; and a connection apparatus which comprises first and second connection units, wherein:

each of the first and second connection units comprises:

a first connector part connected to the optical module, the first connector part comprising a contact surface;

a second connector part connected to the support structure, the second connector part comprising a contact surface that matches the contact surface of the first connector part; and a positioning device configured to act on the first and second connector parts;

for each of the first and second connection units:

the connection unit has an adjustment state and an installed state;

in the installed state, the matching contact surfaces contact each other;

in the adjustment state, a narrow gap between the matching contact surfaces is maintained in a non-contact manner to allow a compensating motion between the matching contact surfaces without an action of force between the first and second connector parts resulting from the compensating motion; and the positioning device is configured to substantially synchronously reduce the narrow gap between the connector parts of the first and the second connection unit; and the optical apparatus is configured to be used in microlithography.

2. The optical apparatus of claim 1, wherein for each of the first and second connection units:

the positioning device comprises a force generation device; and in the adjustment state, the force generation device maintains the narrow gap between the matching contact surfaces by applying a force of attraction between the optical module and the support structure.

3. The optical apparatus of claim 2, wherein for each of the first and second connection units, in the adjustment state, the force generation device maintains the narrow gap between the matching contact surfaces by applying the force of attraction between the first and second connector parts.

4. The optical apparatus of claim 1, wherein for each of the first and second connection units:

the positioning device comprises a force generation device; and in the adjustment state, the force generation device maintains the narrow gap between the matching contact surfaces by applying a force of repulsion between the optical module and the support structure.

5. The optical apparatus of claim 4, wherein for each of the first and second connection units, in the adjustment state, the force generation device maintains the narrow gap between the matching contact surfaces by applying the force of repulsion between the first and second connector parts.

6. The optical apparatus of claim 1, wherein for each of the first and second connection units:

the positioning device comprises a force generation device; and in the adjustment state, the force generation device maintains the narrow gap between the matching contact surfaces by applying an action of force between the optical module and the support structure.

7. The optical apparatus of claim 6, wherein for each of the first and second connection units, in the adjustment state, the force generation device maintains the narrow gap between the first and second contact surfaces by applying the action of force between the first and second connector parts.

8. The optical apparatus of claim 6, wherein for each of the first and second connection units:

the action of force is an electromagnetic force;

a member has an electrically conducting section that can be impinged upon by electrical current; and the member is selected from the group consisting of the optical module, the support structure and combinations thereof.

9. The optical apparatus of claim 6, wherein for each of the first and second connection units:

the action of force is an electrostatic force;

a member has an electrically conducting section that can be impinged upon by electrical charge; and the member is selected from the group consisting of the optical module, the support structure and combinations thereof.

10. The optical apparatus of claim 6, wherein for each of the first and second connection units:

the action of force is a fluidic force; and at least one of the first and second connector parts comprises a feed device configured to provide a fluid in the narrow gap.

11. The optical apparatus of claim 1, wherein for each of the first and second connection units:

the positioning device comprises a force generation device, a detection device and a control device connected with the force generation device and the detection device;

the detection device is configured to detect a value of a variable representative of a dimension of the narrow gap and to pass on a corresponding measurement signal to the control device;

the control device is configured to generate from the measurement signal and a setpoint value a control signal and to pass the control signal on to the force generation device; and the force generation device is configured to generate an action of force between the first and second connector parts as a function of the control signal to maintain the narrow gap between the first and second connector parts.

12. The optical apparatus of claim 1, wherein for each of the first and second connection units:

the first connector part has a first contact surface with a first main curvature defining a first main curvature axis;

the second connector part has a second contact surface with a second main curvature defining a second main curvature axis;

the second main curvature is matched to the first main curvature;

in the installed state of the connection unit, the first contact surface contacts the second contact surface;

in the adjustment state, the narrow gap between the first and second contact surfaces is maintained in a non-contact manner to allow a compensating motion between the first and second contact surfaces about the first main curvature axis without an action of force between the first and second connector parts resulting from the compensating motion.

13. The optical apparatus of claim 12, wherein for each of the first and second connection units:

the first connector part comprises first and second connector element;

the first connector element has a third contact surface with a third main curvature defining a third main curvature axis;

the second connector element has a fourth contact surface with a fourth main curvature defining a fourth main curvature axis;

in the installed state, the fourth main curvature is matched to the third main curvature and the third contact surface contacts the fourth contact surface;

the connection apparatus comprises at least part of the positioning device configured to act on the first and second connector elements; and in the adjustment state, a narrow gap between the third and fourth contact surfaces is maintained in a non-contact manner to allow a compensating motion between the third and fourth contact surfaces about the third main curvature axis without an action of force between the first and second connector parts resulting from the compensating motion.

14. The optical apparatus of claim 12, wherein for each of the first and second connection units:

the positioning device comprises a force generation device, a detection device and a control device connected with the force generation device and the detection device;

the detection device is configured the detect a value of a variable representative of a dimension of the second gap between the first and second connector elements and to pass on a corresponding second measurement signal to the control device;

the control device is configured to generate from the second measurement signal and a second setpoint value a second control signal and to pass the second control signal on to the force generation device; and the force generation device is configured to generate an action of force between the first and second connector elements as a function of the second control signal to maintain the narrow gap between the first and second connector parts.

15. A method, comprising:

using a connection apparatus to connect a support structure with an optical module configured for use in microlithography, wherein:

the connection apparatus comprises first and second connection units, each of the first and second connection unit comprises first and second connector parts;

for each of the first and second connection units:
the first connector part is connected to the optical module and the second connector part is connected to the support structure;
the first connector part has a contact surface;
the second connector part has a contact surface matching the contact surface of the first connector part;
the method further comprises bringing the optical module and the support structure closer to each other so that the matching contact surfaces contact in an installed state; and
in an adjustment state, the method further comprises maintaining a narrow gap between the matching contact surfaces in a non-contact manner to allow a compensating motion between the matching contact surfaces without an action of force between the first and second connector parts resulting from the compensating motion; and the method further comprises substantially synchronously reducing the narrow gaps between the first and second connector parts.

16. The method of claim 15, further comprising applying a force of action between the optical component and the support structure to maintain the narrow gap.

17. The method of claim 16, wherein the force of action comprises a force selected from the group consisting of an electrical force, a magnetic force, a fluidic force and combinations thereof.

18. The method of claim 15, further comprising:
detecting a value of a variable representative of a dimension of the gap between the first and second connector parts;
generating a control signal from the measurement signal and a setpoint value; and
passing the control signal to a force generation device; and using the force generation device to generate an action of force between the first and second connector parts as a function of the control signal to maintain the narrow gap.

19. The method of claim 15, wherein for each of the first and second connection units:
the first connector part has a first contact surface with a first main curvature defining a first main curvature axis;
the second connector part has a second contact surface with a second main curvature defining a second main curvature axis;
the second main curvature is matched to the first main curvature;
in the installed state, the first contact surface contacts the second contact surface;
in the adjustment state, the narrow gap between the first and second contact surfaces is maintained in a non-contact manner to allow a compensating motion between the first and second contact surfaces about the first main curvature axis without an action of force between the first and second connector parts resulting from the compensating motion.

20. The method of claim 19, wherein for each of the first and second connection units:
the first connector part comprises a first connector element and a second connector element;
the first connector element has a third contact surface with a third main curvature defining a third main curvature axis;
the second connector element has a fourth contact with a fourth main curvature defining a fourth main curvature axis;
the fourth main curvature is matched to the third main curvature;
the method comprises bringing the optical module and the support structure closer to one another so that the third contact surface contacts the fourth contact surface in the installed state; and
in the adjustment state, a narrow gap between the third and fourth contact surfaces is maintained in a non-contact manner to allow a second compensating motion between the third and fourth contact surfaces about the third main curvature axis without an action of force between the first and second connector elements resulting from the second compensating motion.

21. The method of claim 20, comprising:
detecting a value of a variable representative of a dimension of the second gap between the first and second connector elements;

passing a corresponding second measurement signal to a control device;

generating a second control signal from the second measurement signal and a second setpoint value;

passing the second control signal to the force generation device; and using the force generation device to maintain the second narrow gap generates an action of force between the optical module and the support structure as a function of the second control signal.

22. The method of claim 15, further comprising reducing the narrow gaps so that the matching contact surfaces of the connector parts of the first and the second connection unit contact each other substantially simultaneously.

23. The method of claim 15, wherein the adjustment state compensates motions in at least two degrees of freedom without a force of action between the components of the connection unit resulting from the compensating motions.

* * * * *

UNITED STATES PATENT AND TRADEMARK OFFICE
CERTIFICATE OF CORRECTION

PATENT NO.            : 10,175,581 B2                               Page 1 of 1
APPLICATION NO.       : 15/697724
DATED                 : January 8, 2019
INVENTOR(S)           : Yim-Bun Patrick Kwan It is certified that error appears in the above-identified patent and that said Letters Patent is hereby corrected as shown below:

In the Specification

Column 2, Line 67, delete "200" and insert -- 200 µm. --.

Column 10, Line 12, delete "al" and insert -- all --.

In the Claims

Column 25, Line 27, in Claim 14, delete "the" and insert -- to --.

Signed and Sealed this
Sixteenth Day of April, 2019

Andrei Iancu
*Director of the United States Patent and Trademark Office*